(12) United States Patent
Yu et al.

(10) Patent No.: US 11,842,955 B2
(45) Date of Patent: *Dec. 12, 2023

(54) METHOD OF MAKING AN INTEGRATED CIRCUIT PACKAGE INCLUDING AN INTEGRATED CIRCUIT DIE SOLDERED TO A BOND PAD OF A REDISTRIBUTION STRUCTURE

(71) Applicant: Taiwan Semiconductor Manufacturing Co., Ltd., Hsinchu (TW)

(72) Inventors: Chen-Hua Yu, Hsinchu (TW); Hung-Jui Kuo, Hsinchu (TW); Ming-Che Ho, Tainan (TW); Tzung-Hui Lee, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/852,766

(22) Filed: Jun. 29, 2022

(65) Prior Publication Data
US 2022/0328386 A1 Oct. 13, 2022

Related U.S. Application Data

(63) Continuation of application No. 15/907,717, filed on Feb. 28, 2018, now Pat. No. 11,410,918.
(Continued)

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS 5,101,550 A 4/1992 Dunaway et al.
9,000,584 B2 4/2015 Lin et al.
(Continued)

FOREIGN PATENT DOCUMENTS

CN 104658989 A 5/2015
CN 106601633 A 4/2017
(Continued)

*Primary Examiner* — Erik Kielin
(74) *Attorney, Agent, or Firm* — Slater Matsil, LLP

(57) ABSTRACT

An integrated circuit package and a method of forming the same are provided. A method includes forming a first redistribution layer over a carrier, the first redistribution layer including a contact pad and a bond pad. A conductive pillar is formed over the contact pad. A backside surface of an integrated circuit die is attached to the bond pad using a solder joint. An encapsulant is formed along a sidewall of the conductive pillar and a sidewall of the integrated circuit die, a front-side surface of the integrated circuit die being substantially level with a topmost surface of the encapsulant and a topmost surface of the conductive pillar. A second redistribution layer is formed over the front-side surface of the integrated circuit die, the topmost surface of the encapsulant and the topmost surface of the conductive pillar.

20 Claims, 25 Drawing Sheets

Related U.S. Application Data

(60) Provisional application No. 62/586,291, filed on Nov. 15, 2017.

(51) Int. Cl.

| | |
|---|---|
| *H01L 21/56* | (2006.01) |
| *H01L 21/683* | (2006.01) |
| *H01L 23/48* | (2006.01) |
| *H01L 23/485* | (2006.01) |
| *H01L 23/00* | (2006.01) |
| *H01L 23/31* | (2006.01) |
| *H01L 25/10* | (2006.01) |

(52) U.S. Cl.
CPC ........ *H01L 21/568* (2013.01); *H01L 21/6835* (2013.01); *H01L 23/481* (2013.01); *H01L 23/485* (2013.01); *H01L 24/19* (2013.01); *H01L 24/20* (2013.01); *H01L 24/83* (2013.01); H01L 21/561 (2013.01); H01L 23/3128 (2013.01); H01L 24/05 (2013.01); H01L 24/13 (2013.01); H01L 25/105 (2013.01); H01L 2221/68345 (2013.01); H01L 2221/68359 (2013.01); H01L 2224/0401 (2013.01); H01L 2224/05624 (2013.01); H01L 2224/05639 (2013.01); H01L 2224/05644 (2013.01); H01L 2224/05647 (2013.01); H01L 2224/05684 (2013.01); H01L 2224/13082 (2013.01); H01L 2224/13124 (2013.01); H01L 2224/13139 (2013.01); H01L 2224/13144 (2013.01); H01L 2224/13147 (2013.01); H01L 2224/13149 (2013.01); H01L 2224/13155 (2013.01); H01L 2224/13166 (2013.01); H01L 2224/13184 (2013.01); H01L 2224/18 (2013.01); H01L 2224/48091 (2013.01); H01L 2224/48227 (2013.01); H01L 2224/73267 (2013.01); H01L 2224/83815 (2013.01); H01L 2225/1058 (2013.01); H01L 2924/00014 (2013.01); H01L 2924/014 (2013.01); H01L 2924/1203 (2013.01); H01L 2924/1304 (2013.01); H01L 2924/181 (2013.01)

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 9,520,374 | B2 | 12/2016 | Kasuya et al. |
| 9,741,690 | B1 | 8/2017 | Hsieh et al. |
| 11,410,918 | B2 * | 8/2022 | Yu ............................ H01L 24/20 |
| 2001/0038151 | A1 | 11/2001 | Takahashi et al. |
| 2002/0074641 | A1 | 6/2002 | Towle et al. |
| 2004/0219717 | A1 | 11/2004 | Takahashi et al. |
| 2005/0104168 | A1 | 5/2005 | Choi et al. |
| 2006/0035412 | A1 | 2/2006 | Popescu |
| 2006/0060637 | A1 | 3/2006 | Susheel et al. |
| 2008/0246126 | A1 | 10/2008 | Bowles et al. |
| 2009/0072391 | A1 | 3/2009 | Kolan et al. |
| 2011/0089546 | A1 | 4/2011 | Bayan |
| 2011/0193225 | A1 | 8/2011 | Chen et al. |
| 2014/0070403 | A1 | 3/2014 | Pan et al. |
| 2014/0077361 | A1 | 3/2014 | Lin et al. |
| 2015/0140806 | A1 | 5/2015 | Radulescu et al. |
| 2015/0145142 | A1 | 5/2015 | Lin et al. |
| 2015/0179591 | A1 | 6/2015 | Tsai et al. |
| 2015/0179616 | A1 | 6/2015 | Lin et al. |
| 2015/0270247 | A1 | 9/2015 | Chen et al. |
| 2016/0071820 | A1 | 3/2016 | Yu et al. |
| 2016/0111395 | A1 | 4/2016 | Heinrich |
| 2016/0218072 | A1 | 7/2016 | Liao et al. |
| 2016/0240480 | A1 | 8/2016 | Lin et al. |
| 2016/0260684 | A1 | 9/2016 | Zhai et al. |
| 2016/0300797 | A1 | 10/2016 | Shim et al. |
| 2017/0110425 | A1 | 4/2017 | Huang et al. |
| 2017/0317053 | A1 | 11/2017 | Hung et al. |
| 2018/0240729 | A1 | 8/2018 | Kim et al. |
| 2018/0358288 | A1 | 12/2018 | Lee et al. |

FOREIGN PATENT DOCUMENTS

| | | |
|---|---|---|
| CN | 201715681 A | 5/2017 |
| KR | 20080013865 A | 2/2008 |
| KR | 20140035803 A | 3/2014 |
| KR | 20150059635 A | 6/2015 |
| KR | 20170063231 A | 6/2017 |

\* cited by examiner

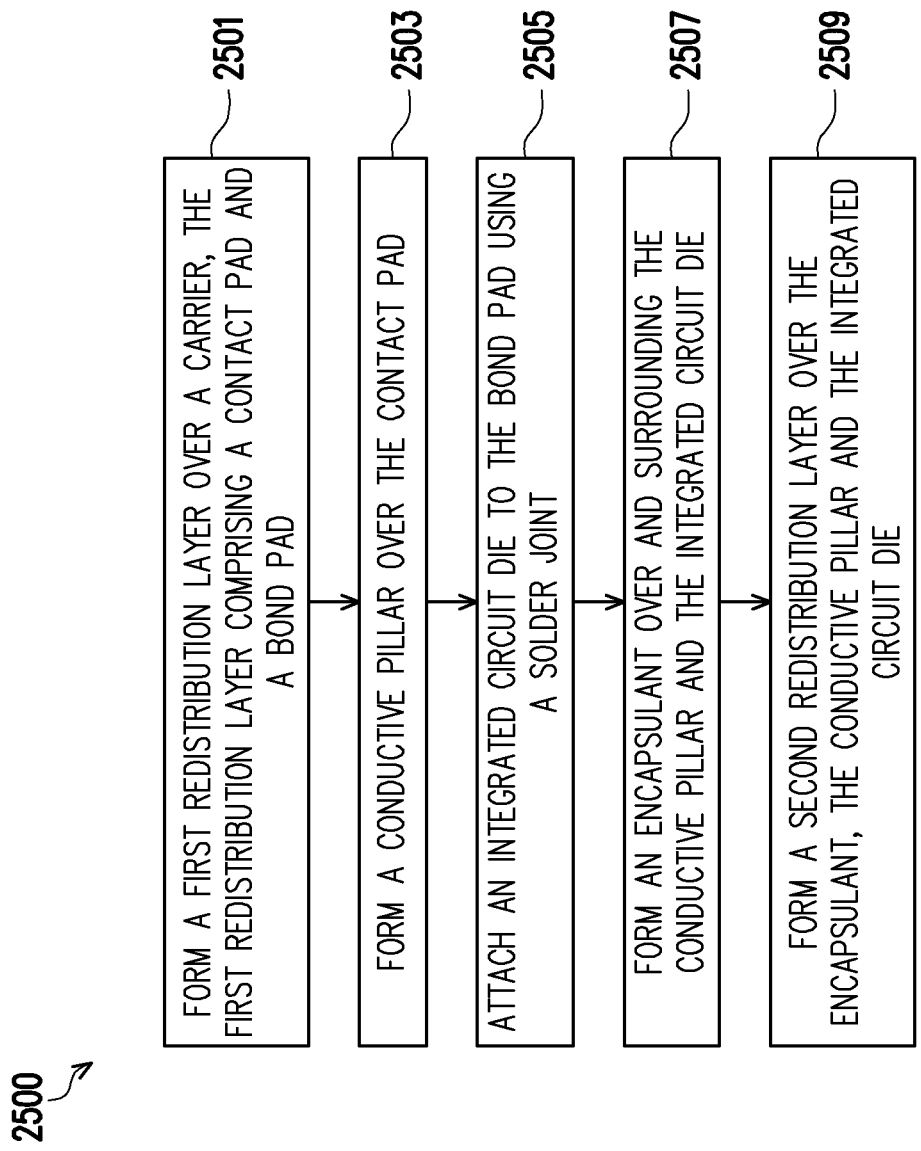

METHOD OF MAKING AN INTEGRATED CIRCUIT PACKAGE INCLUDING AN INTEGRATED CIRCUIT DIE SOLDERED TO A BOND PAD OF A REDISTRIBUTION STRUCTURE

PRIORITY CLAIM AND CROSS-REFERENCE

This application is a continuation of U.S. patent application Ser. No. 15/907,717, filed on Feb. 28, 2018, now U.S. Pat. No. 11,410,918, issued Aug. 9, 2022, entitled "Method of Making an Integrated Circuit Package Including an Integrated Circuit Die Soldered to a Bond Pad of a Redistribution Structure," which claims the benefit of U.S. Provisional Application No. 62/586,291, filed on Nov. 15, 2017, entitled "Integrated Circuit Packages and Methods of Forming Same," each application is hereby incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DICs where dies are packaged and are then packaged together with another packaged die or dies. Chip-on-package (COP) devices are another type of 3DICs where dies are packaged and are then packaged together with another die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 25 is a flow diagram illustrating a method of forming an integrated circuit package in accordance with some embodiments.

DETAILED DESCRIPTION

Figure 1:
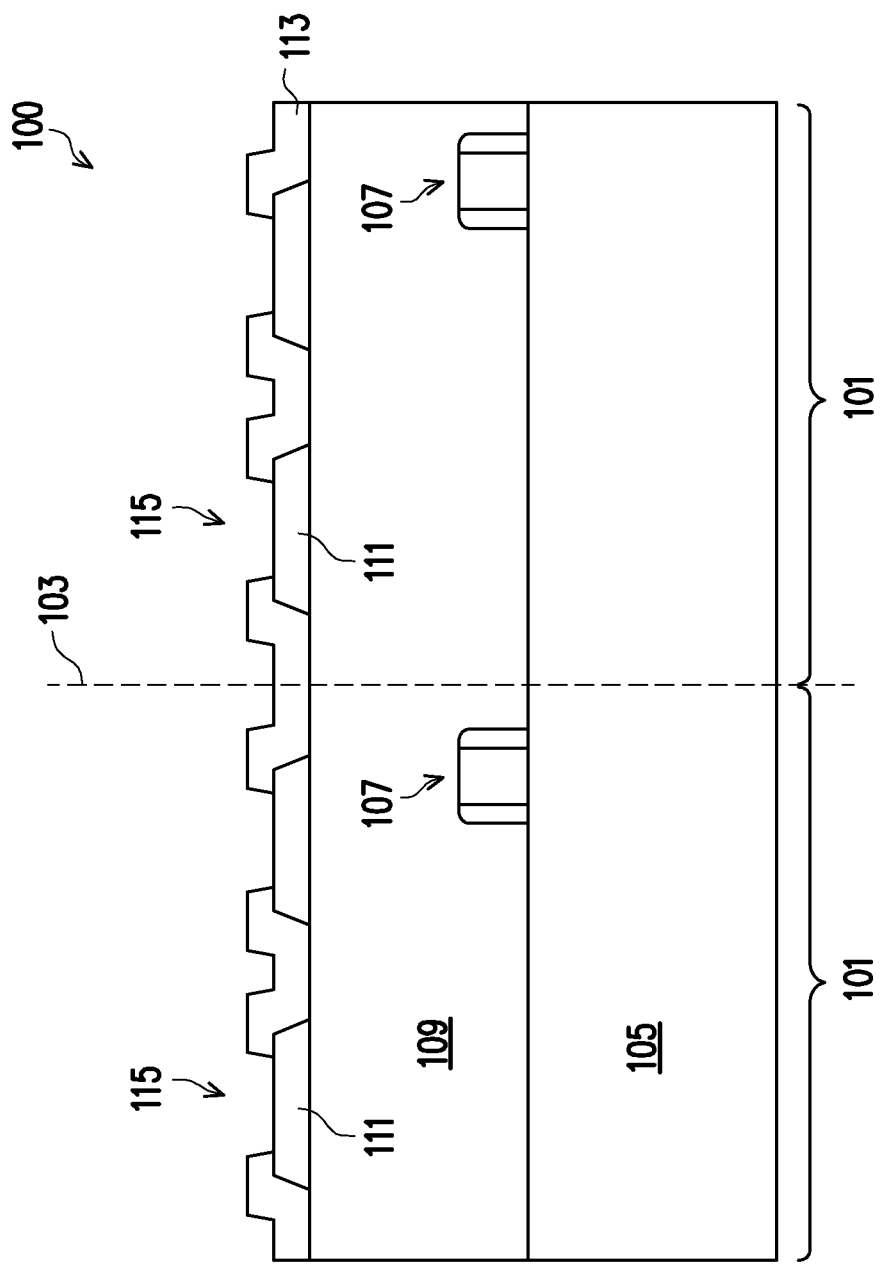
FIGS. 1-10 are cross-sectional views of various processing steps during fabrication of integrated circuit dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely an integrated circuit package such as an integrated fan-out (InFO) package and a PoP package comprising an InFO package. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, or the like, or mounting input components, boards, dies or other components, or for connection packaging or mounting combinations of any type of integrated circuits or electrical components.

Various embodiments described herein allow for forming an integrated circuit package using a die attachment method that allows for reducing or avoiding die alignment issues by reducing or eliminating an overlay shift between the die and an underlying layer (such as an underlying redistribution layer), and allows for reducing thermal resistance of the integrated circuit package. Various embodiments described herein also allow for forming through molding vias directly on an underlying redistribution layer, and reducing contact resistance by modifying seed layers used during formation of redistribution layers. Various embodiments described herein further allow for reducing the number of manufacturing steps and the manufacturing cost for forming integrated circuit packages.

FIGS. 1-10 are cross-sectional views of various processing steps during fabrication of integrated circuit dies in accordance with some embodiments. Referring to FIG. 1, a portion of a workpiece 100 having die regions 101 separated by scribe lines 103 (also referred to as dicing lines or dicing streets) is illustrated. As described below in greater detail, the workpiece 100 will be diced along the scribe lines 103 to form individual integrated circuit dies (such as integrated circuit dies 901 illustrated in FIG. 9). In some embodiments, the workpiece 100 comprises a substrate 105, one or more active and/or passive devices 107 on the substrate 105, and an interconnect structure 109 over the substrate 105 and the one or more active and/or passive devices 107.

In some embodiments, the substrate 105 may be formed of silicon, although it may also be formed of other group III, group IV, and/or group V elements, such as silicon, germanium, gallium, arsenic, and combinations thereof. The substrate 105 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the one or more active and/or passive devices 107 may be formed on the substrate 105 and may include various n-type metal-oxide semiconductor (NMOS) and/or p-type metal-oxide semiconductor (PMOS) devices such as transistors, capacitors, resistors, diodes, photo-diodes, fuses and/or the like. In some embodiments, the one or more active and/or passive devices 107 may be formed using any acceptable methods. One of ordinary skill in the art will appreciate that the above examples are provided for the purpose of illustration only and are not meant to limit the present disclosure in any manner. Other circuitry may be also formed as appropriate for a given application.

In some embodiments, the interconnect structure 109 may be formed over the substrate 105 and the one or more active and/or passive devices 107. The interconnect structure 109 electrically interconnects the one or more active and/or passive devices 107 to form functional electrical circuits within the workpiece 100. The interconnect structure 109 may comprise one or more dielectric layers (not shown) and one or more metallization layers (not shown) within respective dielectric layers. The one or more dielectric layers may include an inter-layer dielectric (ILD)/inter-metal dielectric layers (IMDs) formed over the substrate and the one or more active and/or passive devices. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), a combination thereof, or the like. In some embodiments, the one or more metallization layers may comprise various conductive features (such as conductive contacts in the ILD, and conductive lines and vias in the IMDs) formed in the ILD/IMDs using, for example, a damascene process, a dual damascene process, a combination thereof, or the like. In some embodiments, the conductive features may comprise copper, a copper alloy, silver, gold, tungsten, tantalum, aluminum, a combination thereof, or the like.

In some embodiments, contact pads 111 are formed over the interconnect structure 109. The contact pads 111 may be electrically coupled to the one or more active and/or passive devices 107 through the one or more metallization layers of the interconnect structure 109. In some embodiments, the contact pads 111 may comprise a conductive material such as aluminum, copper, tungsten, silver, gold, a combination thereof, or the like. In some embodiments, a conductive material may be formed over the interconnect structure 109 using, for example, physical vapor deposition (PVD), atomic layer deposition (ALD), electro-chemical plating, electroless plating, a combination thereof, or the like. Subsequently, the conductive material is patterned to form the contact pads 111. In some embodiments, the conductive material may be patterned using suitable photolithography and etching techniques. Generally, photolithography techniques involve depositing a photoresist material (not shown), which is subsequently irradiated (exposed) and developed to remove a portion of the photoresist material. The remaining photoresist material protects the underlying material, such as the conductive material of the contact pads 111 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the contact pads 111. Subsequently, the photoresist material may be removed using, for example, an ashing process followed by a wet clean process.

Referring further to FIG. 1, a passivation layer 113 is formed over the interconnect structure 109 and the contact pads 111. In some embodiments, the passivation layer 113 may comprise one or more layers of non-photo-patternable dielectric materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the passivation layer 113 may comprise one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable dielectric materials may be patterned using similar photolithography methods as a photoresist material.

In some embodiments, the openings 115 are formed in the passivation layer 113 to expose portions of the contact pads 111. In some embodiments where the passivation layer 113 comprises a non-photo-patternable dielectric material, the passivation layer 113 may be patterned using suitable photolithography and etching methods. In some embodiments, a photoresist material (not shown) is formed over the passivation layer 113. The photoresist material is subsequently irradiated (exposed) and developed to remove a portion of the photoresist material. Subsequently, exposed portions of the passivation layer 113 are removed using, for example, a suitable etching process to form the openings 115.

Figure 2:
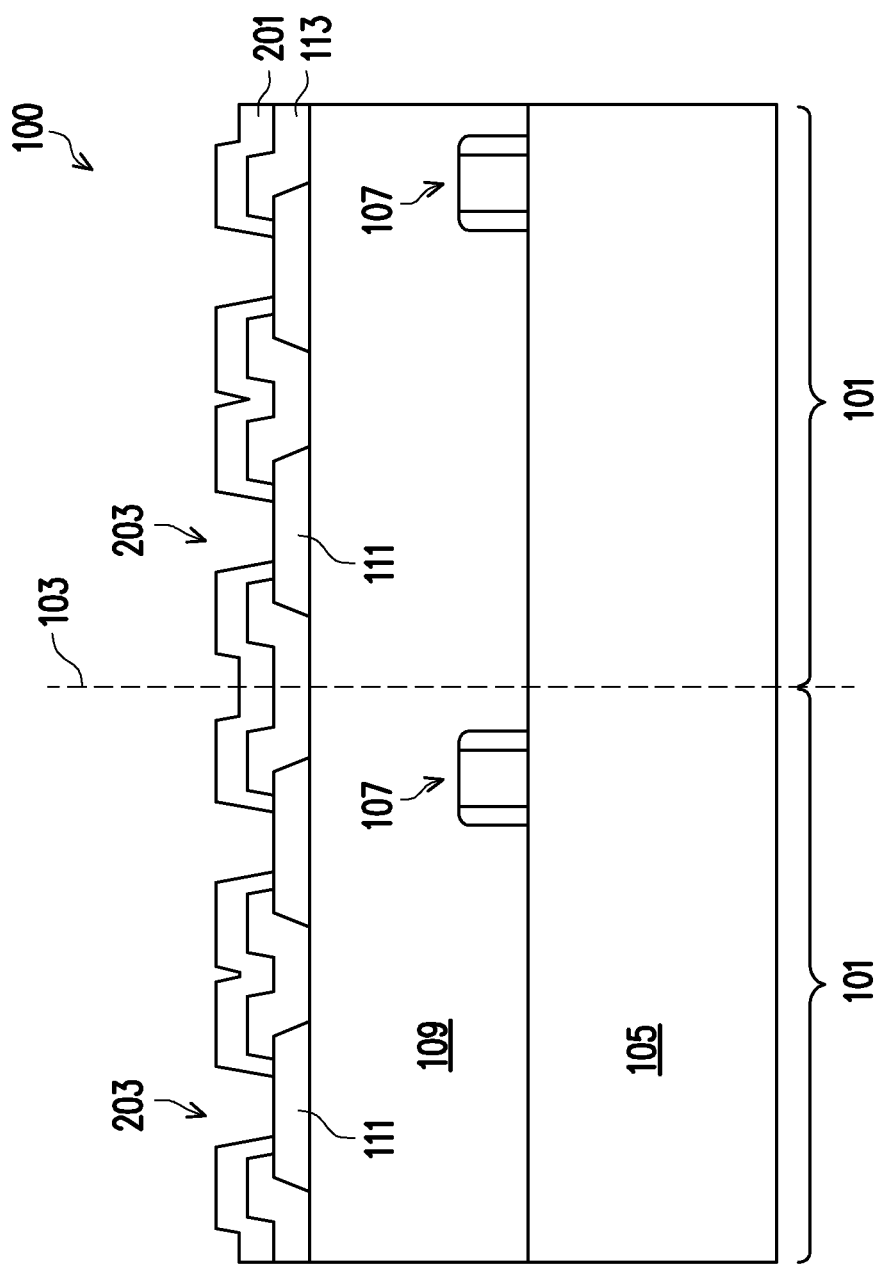

Referring to FIG. 2, a buffer layer 201 is formed over the passivation layer 113 and the contact pads 111. In some embodiments, the buffer layer 201 may comprise one or more layers of photo-patternable insulating materials such as polybenzoxazole (PBO), polyimide (PI), benzocyclobutene (BCB), a combination thereof, or the like, and may be formed using a spin-on coating process, or the like. In some embodiments, the buffer layer 201 is patterned to form openings 203 in the buffer layer 201 and expose the contact pads 111. In some embodiments, the openings 203 may be formed using suitable photolithography techniques to expose the buffer layer 201 to light. In some embodiments, the buffer layer 201 is developed and/or cured after the exposure.

Figure 3:
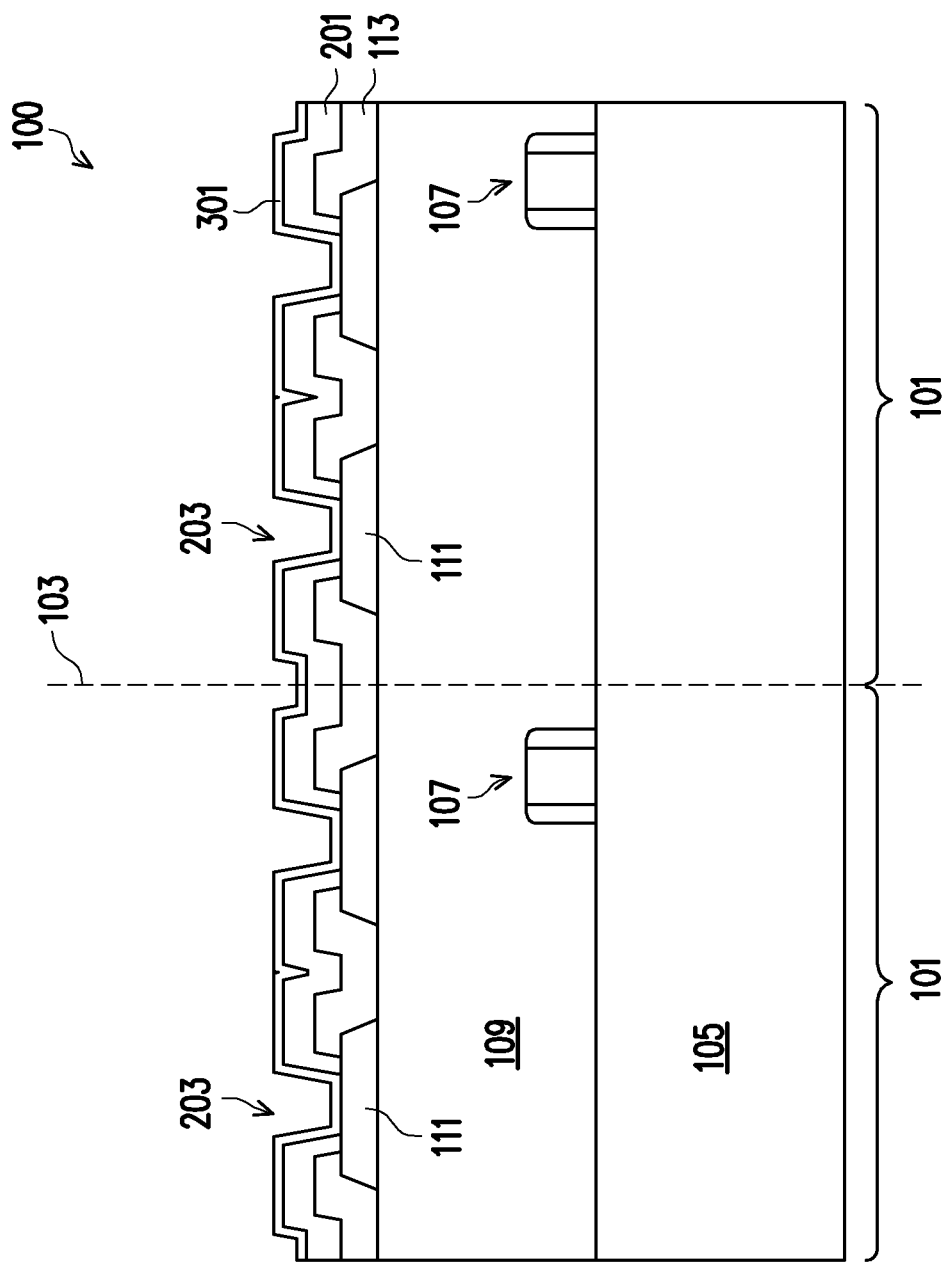

Referring to FIG. 3, a seed layer 301 is blanket deposited over the buffer layer 201 and in the openings 203. The seed layer 301 may comprise one or more layers of copper, titanium, nickel, gold, manganese, a combination thereof, or the like, and may be formed by ALD, PVD, sputtering, a combination thereof, or the like. In some embodiments, the seed layer 301 comprises a layer of copper formed over a layer of titanium.

Figure 4:
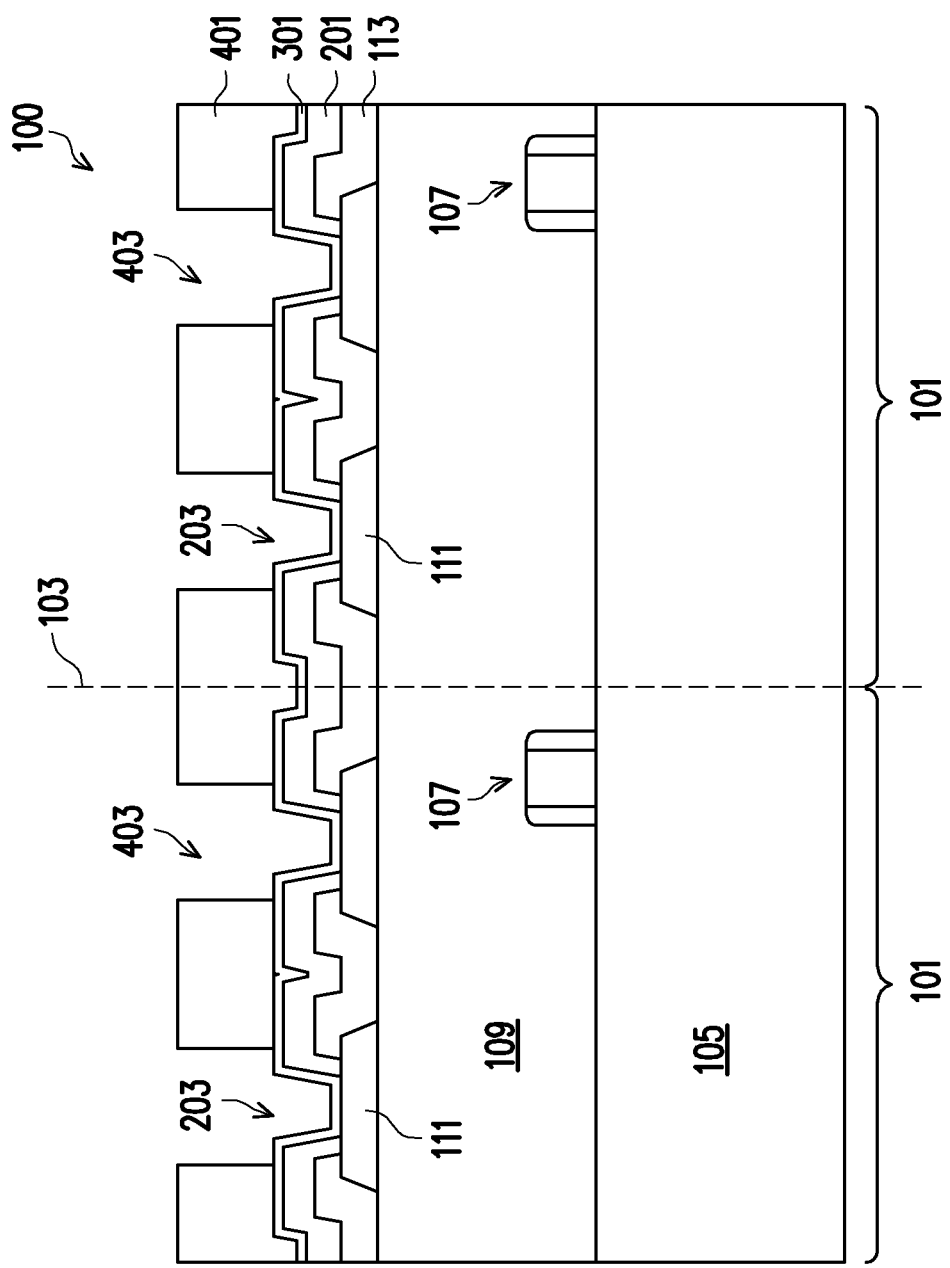

Referring to FIG. 4, a patterned mask 401 having openings 403 therein is formed over the seed layer 301. In some embodiments, the patterned mask 401 comprises a photoresist material, or any photo-patternable material. In some embodiments, a material of the patterned mask 401 is deposited, irradiated (exposed) and developed to remove portions of the material and form openings 403, thereby forming the patterned mask 401. In the illustrated embodiment, the openings 403 expose portions of the seed layer 301 formed over the contact pads 111 in the openings 203. As discussed in greater detail below, conductive pillars (such as conductive pillars 501 illustrated in FIG. 5) will be formed in the openings 403 to provide electrical connections to the contact pads 111.

Figure 5:
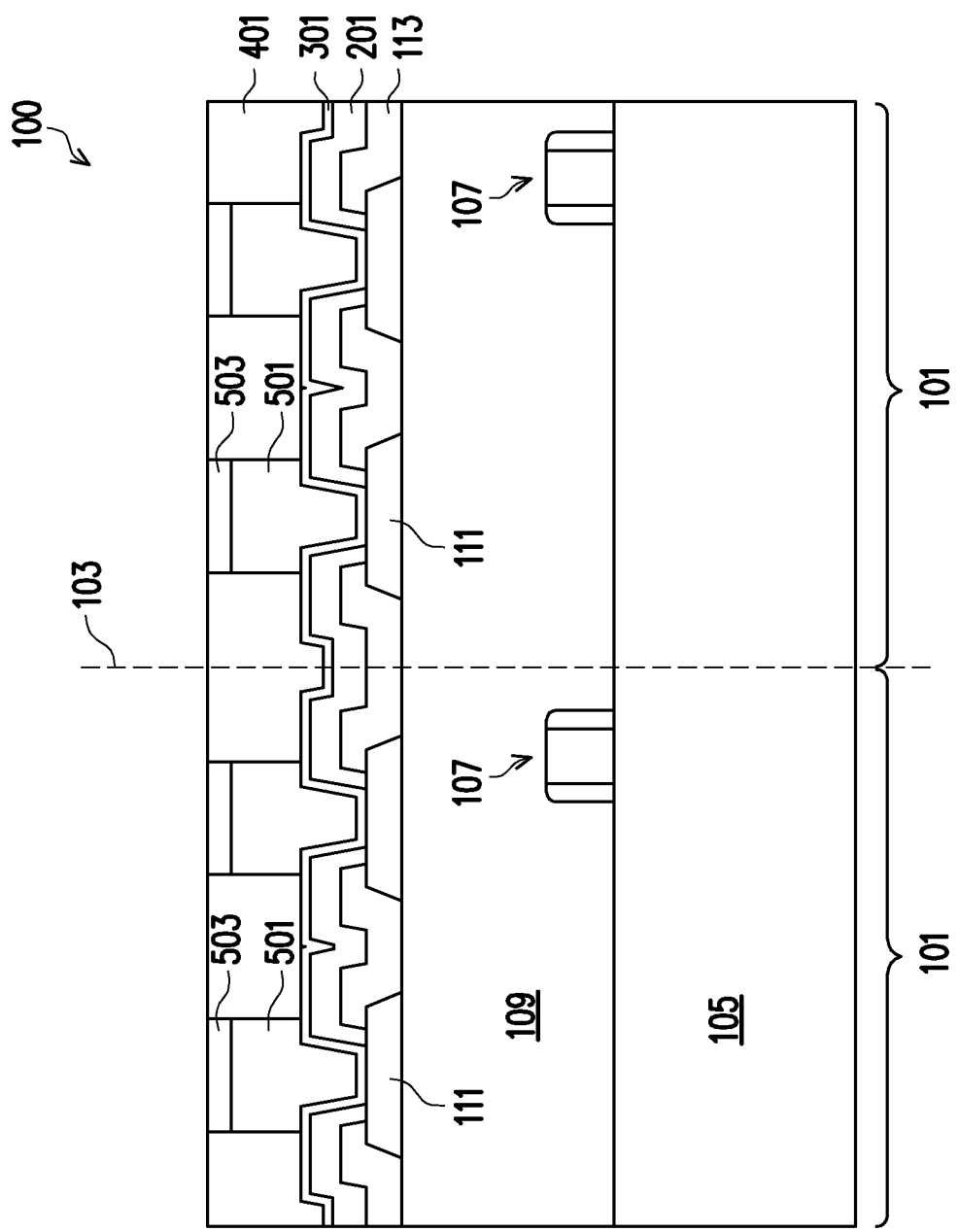

Referring to FIG. 5, conductive pillars 501 are formed in combined openings formed of the openings 403 and 203 (see FIG. 4). In some embodiments, the combined openings are filled with a conductive material such as copper, tungsten, aluminum, silver, gold, a combination thereof, or the like, using an electro-chemical plating process, an electroless plating process, ALD, PVD, a combination thereof, or the like to form the conductive pillars 501. In some embodiments, the conductive pillars 501 partially fill the combined openings and remaining portions of the combined openings are filled with a solder material to from solder layers 503 over the conductive pillars 501. In some embodiments, the solder materials may be lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu). In some embodiments, the solder layers 503 may be formed using evaporation, an electro-chemical plating process, an electroless plating process, printing, solder transfer, a combination thereof, or the like.

Figure 6:
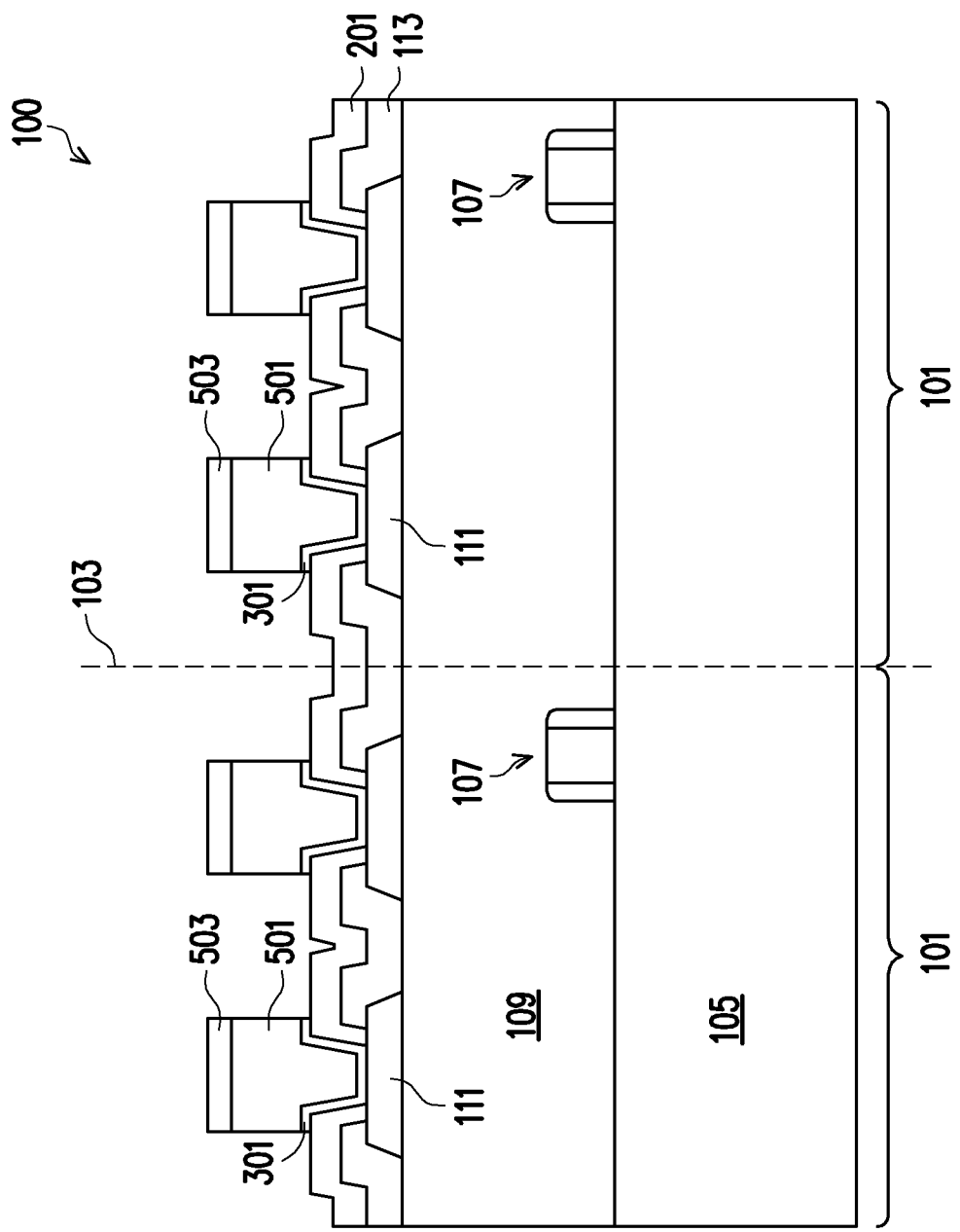

Referring to FIG. 6, after forming the conductive pillars 501 and the solder layers 503, the patterned mask 401 (see FIG. 5) is removed. In some embodiments, the patterned mask 401 comprising a photoresist material may be removed using, for example, an ashing process followed by a wet clean process. Subsequently, exposed portions of the seed layer 301 are removed using, for example, a suitable etching process. In some embodiments, after removing the exposed portions of the seed layer 301, each of the die regions 101 may be electrically tested to identify known good dies (KGDs) for further processing. In some embodiments, a probe card of an electrical testing system may contact the solder layers 503 during the electrical testing process. In some embodiments, after completing the electrical testing process, the solder layers 503 are removed from respective conductive pillars 501. In some embodiments, the solder layers 503 may be removed using a suitable removal process, such as, for example, a suitable etching process. In the illustrated embodiment, the solder layers 503 are removed immediately after completing the electrical testing process. In other embodiments, the solder layers 503 may be removed at a later step of the manufacturing process, such as, for example, during subsequent packaging steps.

Figure 7:
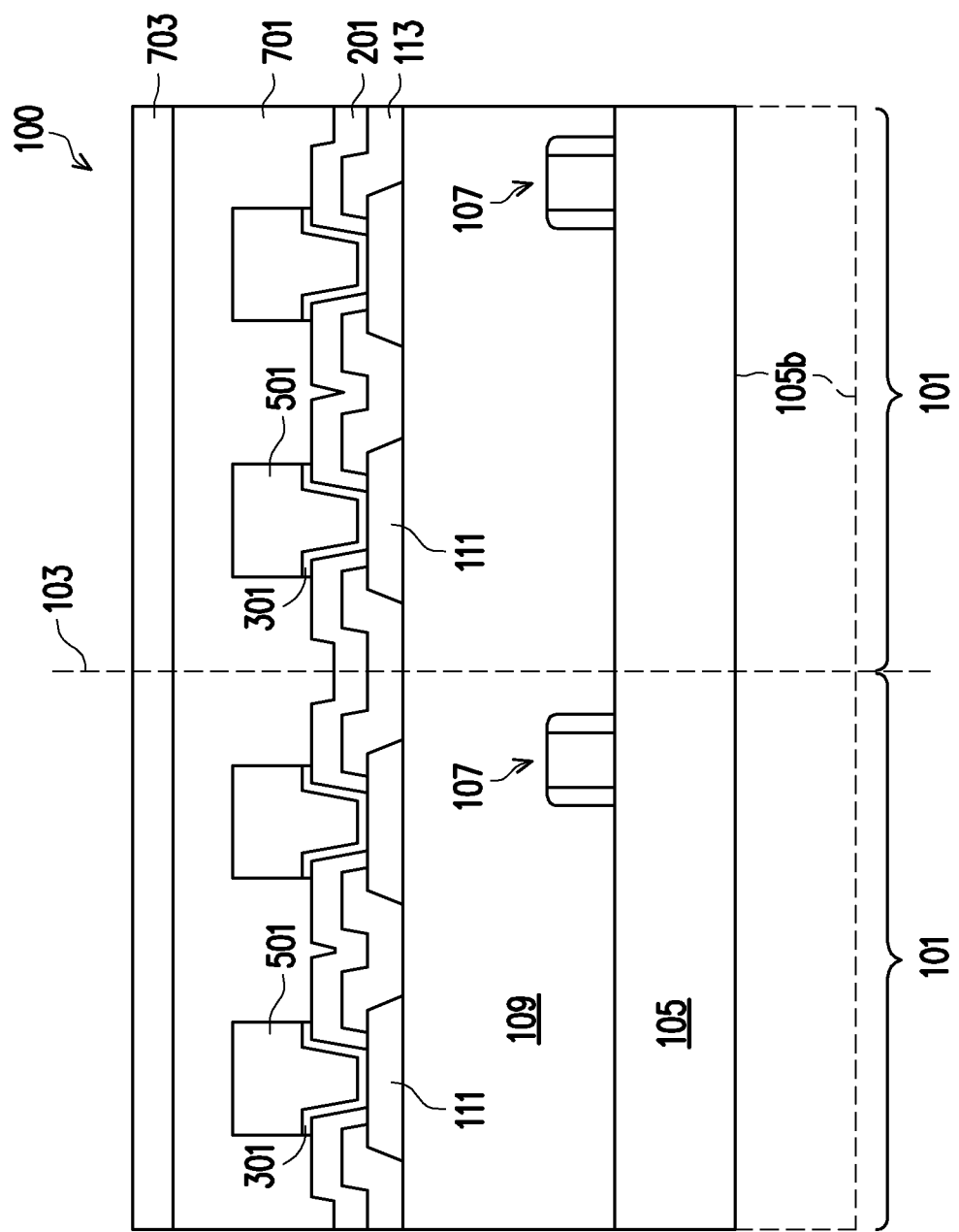

Referring to FIG. 7, after removing the solder layers 503, a protective layer 701 is formed over and surrounding the conductive pillars 501. In some embodiments, the protective layer 701 may comprise one or more layers of photo-patternable insulating materials such as polybenzoxazole (PBO), polyimide (PI), benzocyclobutene (BCB), a combination thereof, or the like, and may be formed using a spin-on coating process, or the like.

Referring further to FIG. 7, in some embodiments, it is desirable to back grind the substrate 105, for example, to reduce the thickness of the workpiece 100, and thicknesses of subsequently formed integrated circuit dies. In such embodiments, a thinning process is performed, where a tape 703 such as a back grinding (BG) tape is applied to a top surface of the protective layer 701, and a backside 105b of the substrate 105 is thinned by grinding, etching, a CMP process, a combination thereof, or the like. In some embodiments, the tape 703 protects the workpiece 100 from contamination caused by grinding/etching fluids and/or debris.

Figure 8:
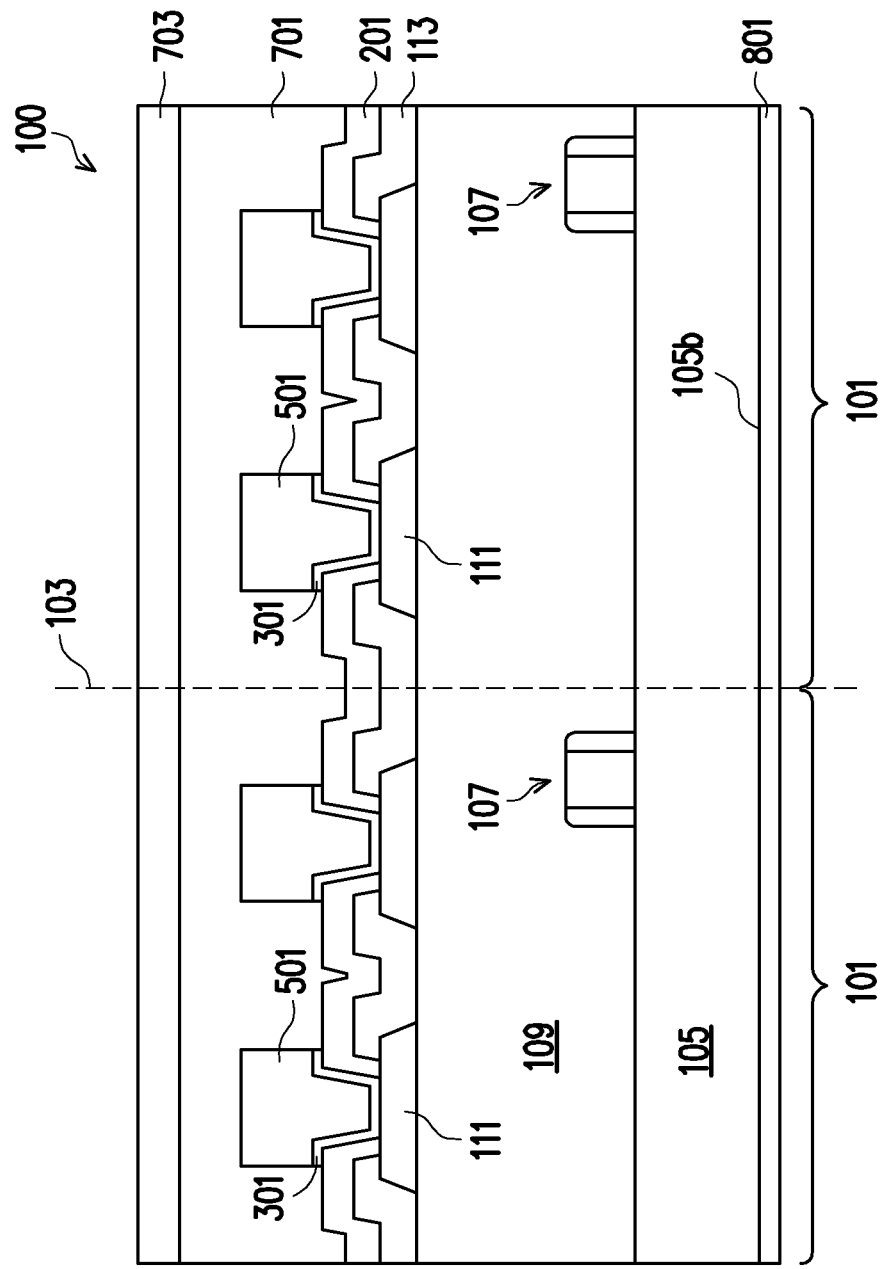

Referring to FIG. 8, after the thinning process described above is completed, a seed layer 801 is formed on the backside 105b of the substrate 105. In some embodiments, the seed layer 801 may be formed using similar materials and methods as the seed layer 301 described above with reference to FIG. 3 and the description is not repeated herein. In some embodiments, the seed layer 801 may have a thickness between about 0.06 µm and about 1.1 µm. In some embodiments, the seed layer 801 may comprise a layer of titanium having a thickness between about 0.01 µm and about 0.1 µm, and a layer of copper having a thickness between about 0.05 µm and about 1 µm.

Figure 9:
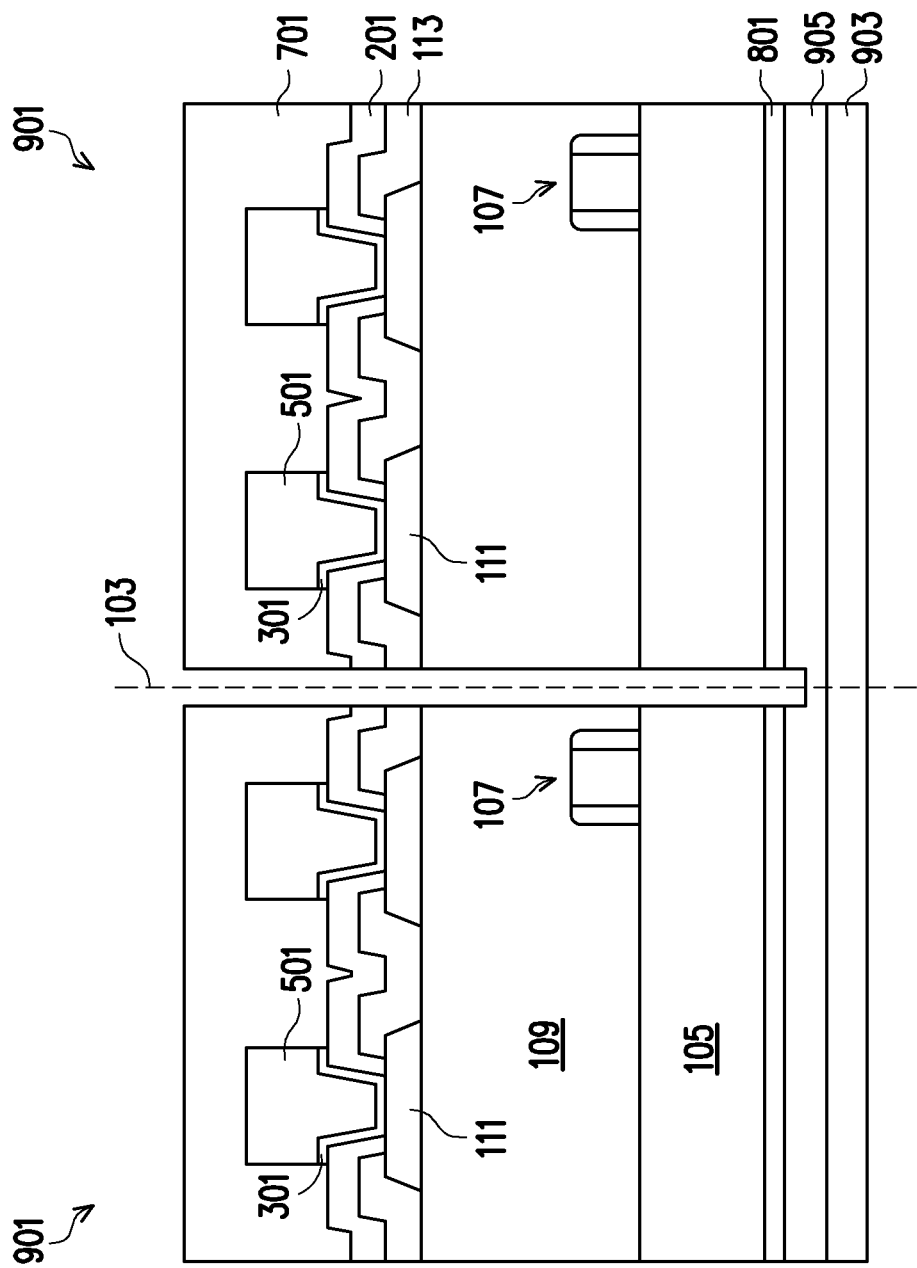

Referring to FIG. 9, after forming the seed layer 801, the tape 703 (see FIG. 8) is removed and the workpiece 100 is singulated to form individual integrated circuit dies 901. In some embodiments, the workpiece 100 may be attached to a frame 903 using an adhesive 905 to prepare the workpiece 100 for a subsequent dicing process. In some embodiments, the frame 903 may be a film frame or any suitable carrier to provide mechanical support for subsequent operations, such as dicing. The adhesive 905 may be a die attach film, a dicing film, or any suitable adhesive, epoxy, ultraviolet (UV) glue (which loses its adhesive property when exposed to UV radiation), or the like, and may be formed using a deposition process, a spin coating process, a printing process, a lamination process, or the like. In some embodiments, the adhesive 905 may have a multilayer structure and may comprise a release layer (not show). The release layer may help to safely remove individual integrated circuit dies 901 from the frame 903 after the dicing process is completed. In some embodiments, the release layer may be a UV type, wherein adhesive strength of the release layer is substantially reduced after exposing the release layer to UV radiation. In other embodiments, the release layer may be a thermal type, wherein adhesive strength of the release layer is substantially reduced after exposing the release layer to a suitable heat source. In some embodiments, the workpiece 100 may be singulated into individual integrated circuit dies 901, for example, by sawing, laser ablation, a combination thereof, or the like.

As shown in FIG. 9, each integrated circuit die 901 comprises a single passivation layer (such as the passivation layer 113), a single buffer layer (such as the buffer layer 201), two contact pads (such as the contact pads 111), two conductive pillars (such as the conductive pillars 501), and a single protective layer (such as the protective layer 701). One skilled in the art will recognize that numbers of passivation layers, buffer layers, contact pads, conductive pillars, and the protective layers are provided for illustrative purpose only and are not limiting the scope of the present disclosure. In other embodiments, each integrated circuit die 901 may comprise appropriate numbers of passivation layers, buffer layers, contact pads, conductive pillars, and protective layers depending on design requirements for the integrated circuit dies 901.

Figure 10:
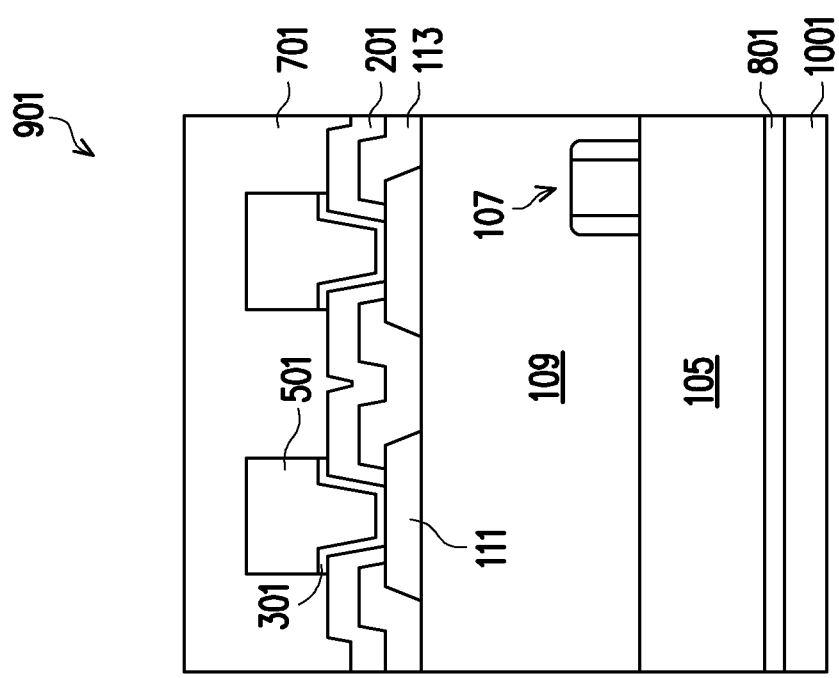

Referring to FIG. 10, after singulating the workpiece 100 into the integrated circuit dies 901, a solder paste 1001 is applied to the seed layer 801 of each integrated circuit die 901. In some embodiments, the solder paste 1001 may be applied to the seed layer 801 using a printing process, a dipping process, a combination thereof, or the like. In some embodiments, the solder paste 1001 may comprise a solder material and a flux. In other embodiments, the solder paste 1001 may be a flux-less solder paste. In some embodiments, the solder material of the solder paste 1001 may comprise similar materials as the solder layers 503 described above with reference to FIG. 5 and the description is not repeated herein. In some embodiments, the solder paste 1001 may have a thickness between about 5 µm and about 100 µm.

Referring further to FIGS. 9 and 10, in the illustrated embodiment, the solder paste 1001 is applied to the integrated circuit dies 901 after singulating the workpiece 100 into the integrated circuit dies 901. In other embodiments, the solder paste 1001 may be applied to the workpiece 100 before singulating the workpiece 100 into the integrated circuit dies 901. In such embodiments, a dicing saw may be contaminated by the solder paste 1001 during the singulation process. In some embodiments, a suitable cleaning process may be performed on the dicing saw to remove contaminants from the dicing saw. As described below in greater detail, the solder paste 1001 may be used to attach the integrated circuit dies 901 to an underlying redistribution layer during subsequent packaging steps.

Figure 11:
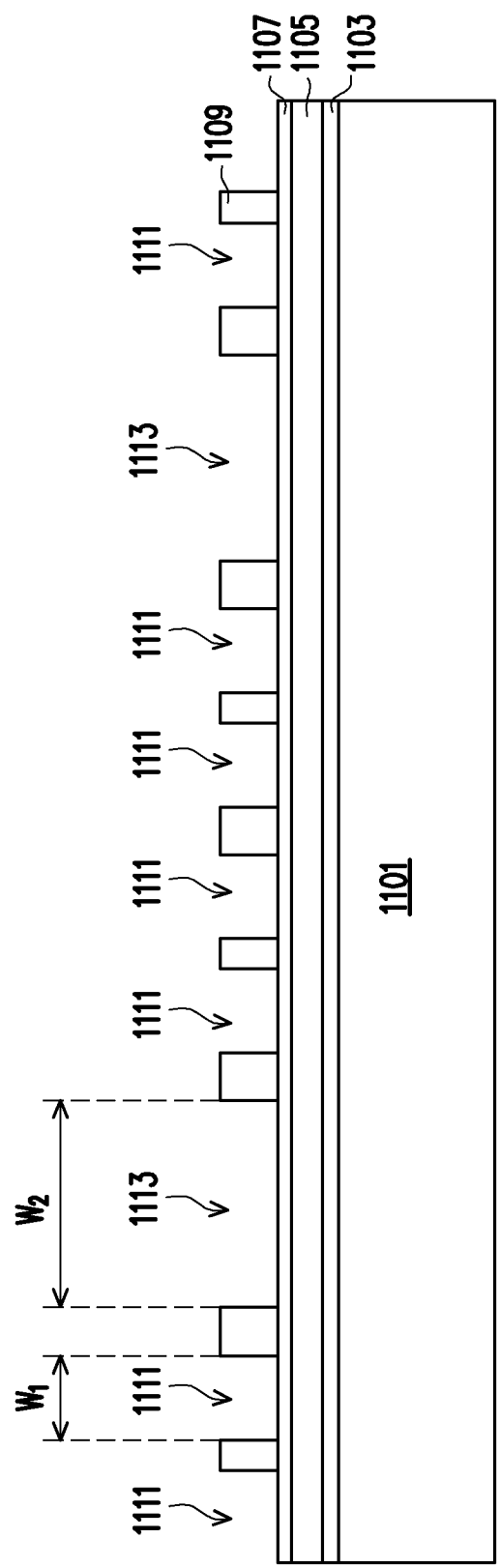
FIGS. 11-21 are cross-sectional views of various processing steps during fabrication of integrated circuit packages in accordance with some embodiments.

FIGS. 11-21 are cross-sectional views of various processing steps during fabrication of integrated circuit packages using the integrated circuit dies fabricated in FIGS. 1-10 in accordance with some embodiments. Referring first to FIG. 11, in some embodiments, a release layer 1103 is formed over a carrier 1101, and an insulating layer 1105 is formed over the release layer 1103 to start forming integrated circuit packages. In some embodiments, the carrier 1101 may be formed of quartz, glass, or the like, and provides mechanical support for subsequent operations. In some embodiments, the release layer 1103 may comprise a light to heat conversion (LTHC) material, a UV adhesive, a polymer layer, or the like, and may be formed using a spin-on coating process, a printing process, a lamination process, or the like. In some embodiments where the release layer 1103 is formed of a LTHC material, the release layer 1103 when exposed to light partially or fully loses its adhesive strength and the carrier 1101 can be easily removed from a back side of a subsequently formed structure. In some embodiments, the insulating layer 1105 may be formed using similar materials and methods as the buffer layer 201 described above with reference to FIG. 2 and the description is not repeated herein.

Referring further to FIG. 11, a seed layer 1107 is formed over the insulating layer 1105. In some embodiments, the seed layer 1107 may be formed using similar materials and methods as the seed layer 301 described above with reference to FIG. 3 and the description is not repeated herein. In some embodiments, the seed layer 1107 may comprise a layer of titanium having a thickness between about 0.01 µm and about 0.1 µm, and a layer of copper having a thickness between about 0.06 µm and about 1.1 µm. In some embodiments, the layer of titanium may be omitted and the seed layer 1107 may comprise a layer of copper having a thickness between about 0.12 µm and about 0.7 µm. In such embodiments, by omitting the layer of titanium, a contact resistance of a resulting redistribution layer may be reduced.

In some embodiments, a patterned mask 1109 having openings 1111 and 1113 therein is formed over the seed layer 1107. In some embodiments, the patterned mask 1109 may be formed using similar materials and methods as the patterned mask 401 described above with reference to FIG. 4 and the description is not repeated herein. In the illustrated embodiment, the patterned mask 401 comprises a photoresist material and is patterned using suitable photolithography methods. As described below in great detail, a conductive material is formed in the openings 1111 and 1113 to form a redistribution layer. In some embodiments, the conductive material formed in the openings 1111 may form contact pads, which provide electrical connections to subsequently formed conductive vias. In some embodiments, the conductive material formed in the openings 1113 may form bond pads, to which integrated circuit dies are subsequently attached. In some embodiments, a width $W_1$ of the openings 1111 may be less than a width $W_2$ of the openings 1113. In some embodiments, the width $W_1$ may be between about 120 µm and about 500 µm. In some embodiments, the width $W_2$ may be between about 0.5 mm and about 2 mm. In some embodiments, a ratio $W_1/W_2$ may be between about 0.06 and about 1.

Figure 12:
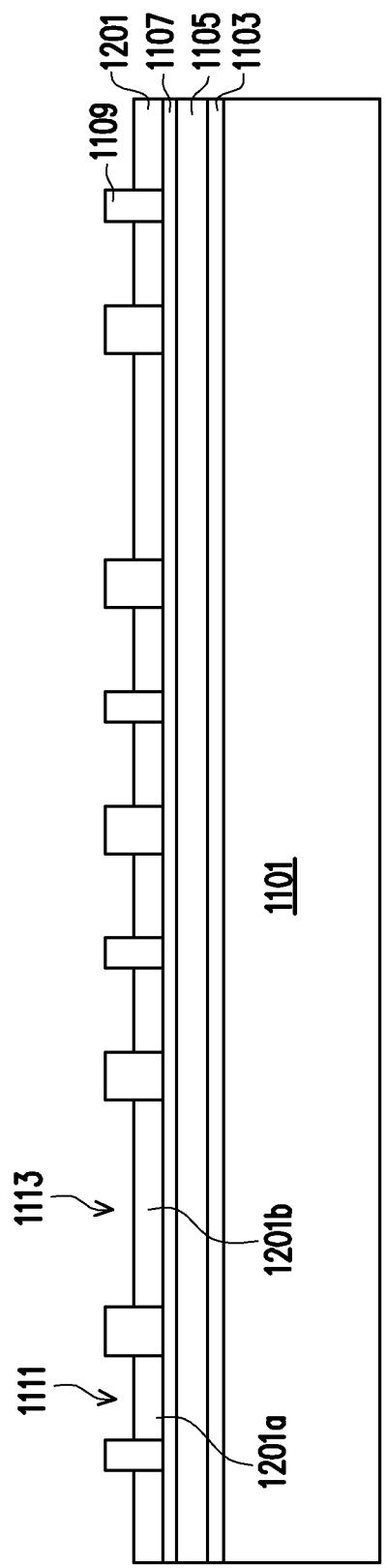

Referring to FIG. 12, a conductive material 1201 is formed in the openings 1111 and 1113. In some embodiments, the conductive material 1201 may comprise copper, tungsten, aluminum, silver, gold, a combination thereof, or the like, and may be formed using an electro-chemical plating process, an electroless plating process, ALD, PVD, a combination thereof, or the like. In some embodiments, the conductive material 1201 comprises first portions 1201a formed within the openings 1111 and second portions 1201b formed within the openings 1113. In some embodiments, the first portions 1201a of the conductive material 1201 may have a substantially same width as the openings 1111. In some embodiments, the second portions 1201b of the conductive material 1201 may have a substantially same width as the openings 1113.

Figure 13:
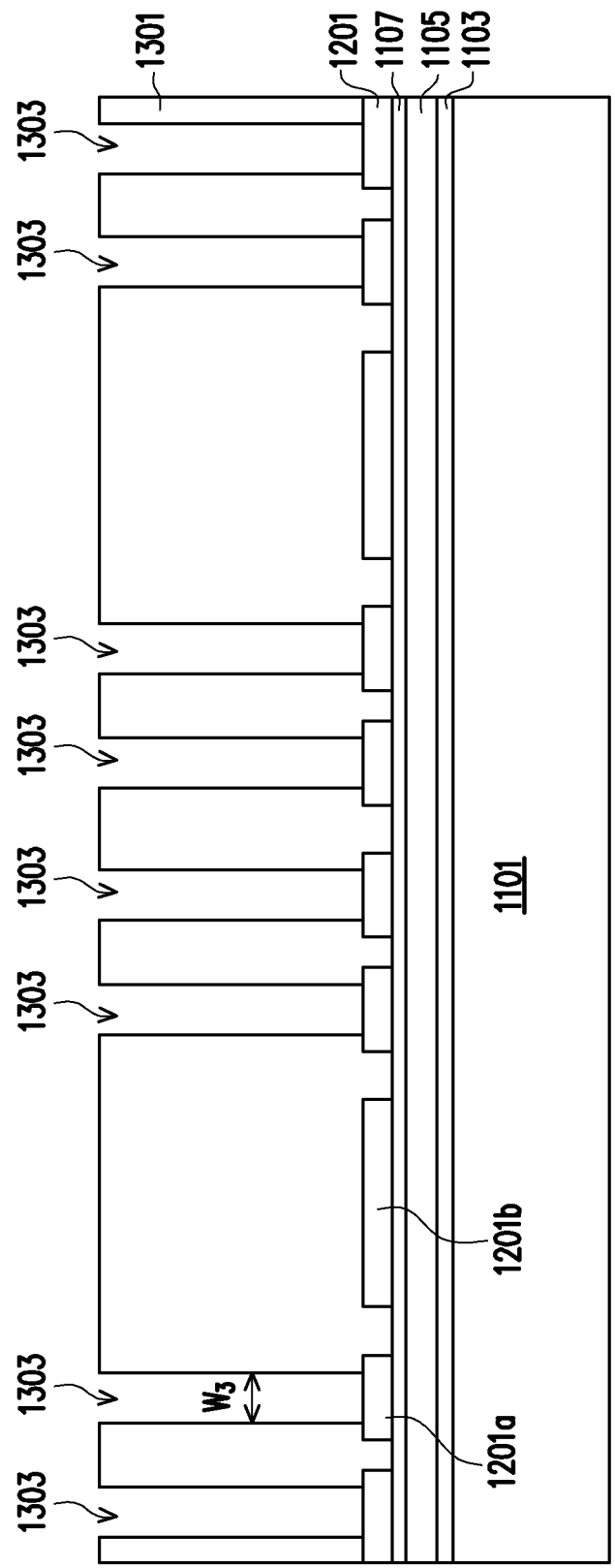

Referring to FIG. 13, after forming the conductive material 1201, the patterned mask 1109 (see FIG. 12) is removed. In some embodiments, the patterned mask 1109 may be removed using similar methods as the patterned mask 401 described above with reference to FIG. 6 and the description is not repeated herein. In some embodiments, after removing the patterned mask 1109, a patterned mask 1301 having openings 1303 therein is formed over the seed layer 1107 and the conductive material 1201. In some embodiments, the patterned mask 1301 may be formed using similar materials and methods as the patterned mask 401 described above with reference to FIG. 4 and the description is not repeated herein. In the illustrated embodiment, the patterned mask 1301 comprises a dry photo-patternable film, which is laminated over the seed layer 1107 and the conductive material 1201, and which is patterned using suitable photolithography methods. In some embodiments, the patterned mask 1301 protects the second portions 1201b of the conductive material 1201 and exposes the first portions 1201a of the conductive material 1201 through respective openings 1303. In some embodiments, the openings 1303 may have a width $W_3$ between about 100 μm and about 300 μm.

Figure 14:
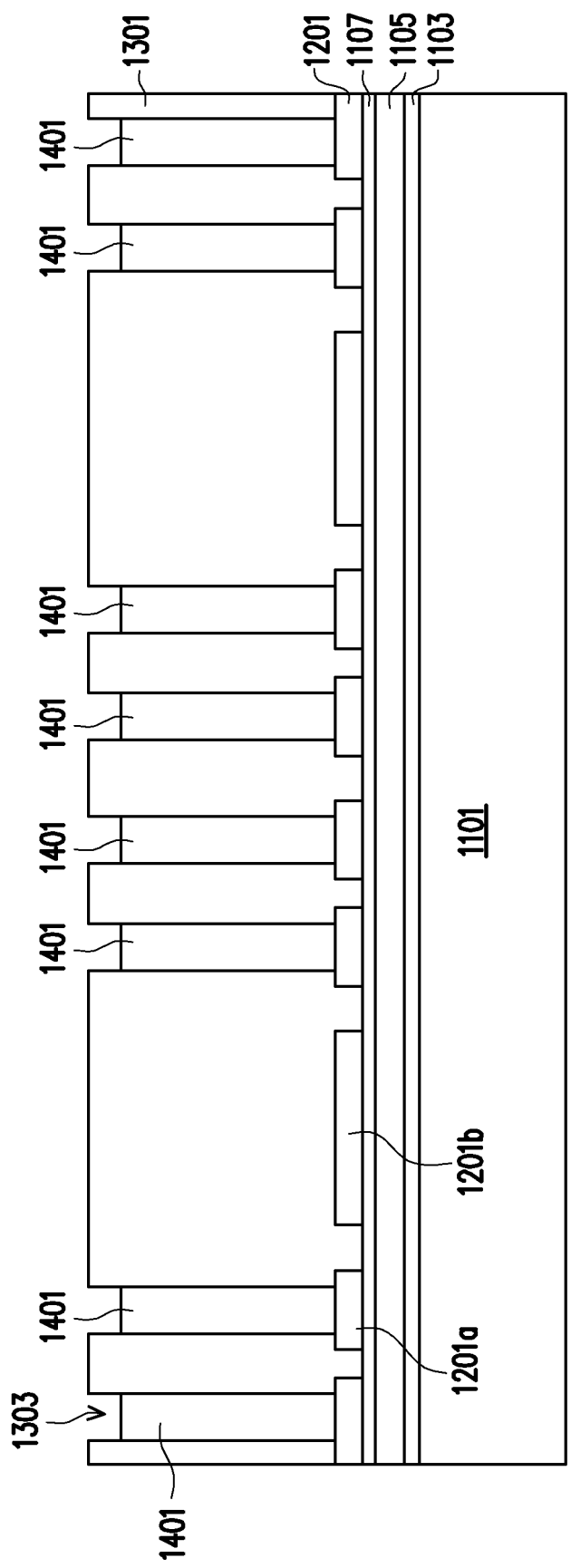

Referring to FIG. 14, conductive pillars 1401 are formed in the openings 1303. In some embodiments, the conductive pillars 1401 may be formed using similar materials and methods as the conductive pillars 501 described above with reference to FIG. 5 and the description is not repeated herein. In some embodiments, the conductive pillars 1401 may also be referred to as conductive vias 1401 or through-molding vias 1401. In some embodiments, the conductive pillars 1401 may have a substantially same width as the opening 1303.

Figure 15:
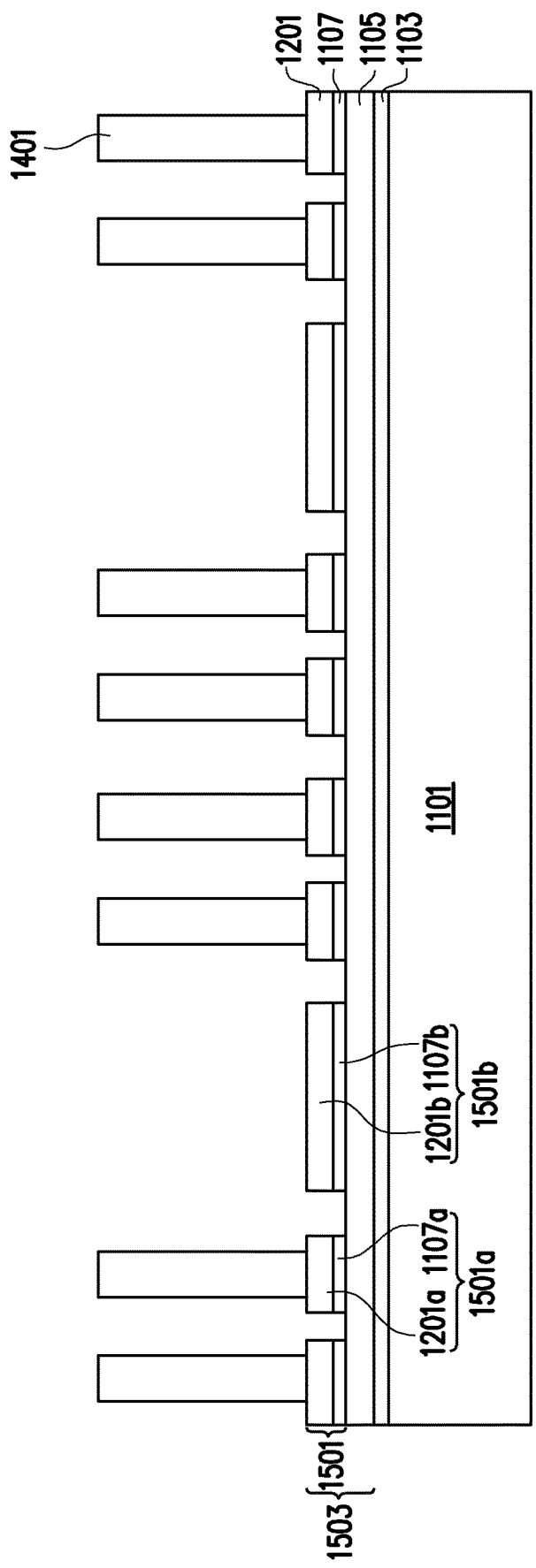

Referring to FIG. 15, after forming the conductive pillars 1401, the patterned mask 1301 (see FIG. 14) is removed. In some embodiments where the patterned mask 1301 comprises the dry photo-patternable film, the patterned mask 1301 may be removed using, for example, an ashing process followed by a wet clean process. Subsequently, exposed portions of the seed layer 1107 are removed. In some embodiments, the exposed portions of the seed layer 1107 may be removed using similar methods as the exposed portions of the seed layer 301 described above with reference to FIG. 6 and the description is not repeated herein. In some embodiments, first portions 1107a of the seed layer 1107 protected by the first portions 1201a of the conductive material 1201 and second portions 1107b of the seed layer 1107 protected by the second portions 1201b of the conductive material 1201 remain after the removal process. In some embodiments, the conductive material 1201 and remaining portions of the seed layer 1107 may be collectively referred to as a redistribution layer (RDL) 1501. In some embodiments, the RDL 1501 and the insulating layer 1105 may be collectively referred to as a redistribution structure 1503. In some embodiments, the first portions 1201a of the conductive material 1201 and corresponding first portions 1107a of the seed layer 1107 may be referred to as contact pads 1501a of the RDL 1501. In some embodiments, the second portions 1201b of the conductive material 1201 and corresponding second portions 1107b of the seed layer 1107 may be referred to as bond pads 1501b of the RDL 1501. In some embodiments, the contact pads 1501a are electrically coupled to corresponding conductive pillars 1401. As described below in greater detail, integrated circuit dies are bonded to the bond pads 1501b in a subsequent process. In some embodiments, the contact pads 1501a may be electrically coupled to each other. In some embodiments, each of the bond pads 1501b may be electrically isolated from other bond pads 1501b and each of the contact pads 1501a. In other embodiments, the contact pads 1501a and the bond pads 1501b may be electrically coupled to each other.

As shown in FIG. 15, the redistribution structure 1503 comprises one insulating layer (such as the insulating layer 1105) and one RDL (such as the RDL 1501). One skilled in the art will recognize that the number of insulating layers and the number of RDLs are provided for illustrative purpose only and are not limiting the scope of the present disclosure. In other embodiments, the redistribution structure may comprise appropriate numbers of insulating layers and RDLs depending on design requirements for the resulting packaged device.

Figure 16:
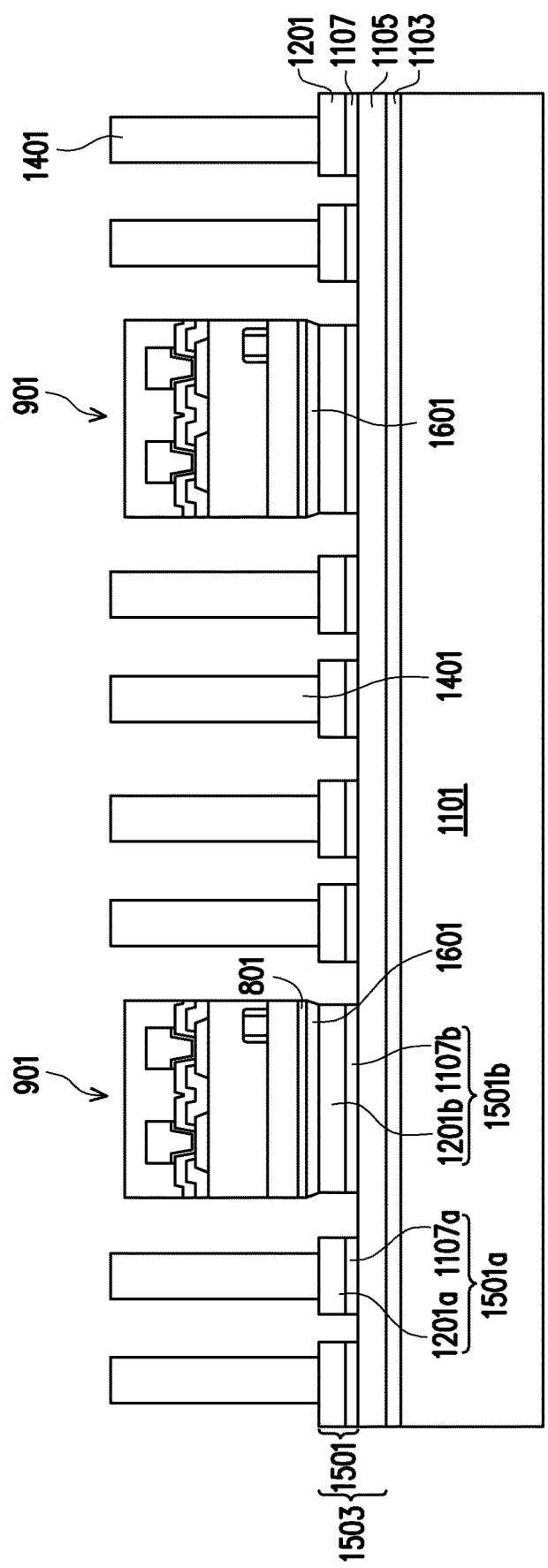

Referring to FIG. 16, integrated circuit dies 901 (see FIG. 10) are attached to respective bond pads 1501b of the RDL 1501. In some embodiments, the integrated circuit dies 901 are placed on the respective bond pads 1501b of the RDL 1501 using, for example, a pick-and-place apparatus. In other embodiments, the integrated circuit dies 901 may be placed on the respective bond pads 1501b of the RDL 1501 manually, or using any other suitable method. In some embodiments, after placing the integrated circuit dies 901 on the respective bond pads 1501b of the RDL 1501, a reflow process is performed on the solder paste 1001 (see FIG. 10) to form solder joints 1601 that attach the integrated circuit dies 901 to the respective bond pads 1501b of the RDL 1501. In some embodiments, a width of the solder joints 1601 is substantially same as a width of the integrated circuit dies 901. In some embodiments, the reflow process may be performed at a temperature between about 110° C. and about 260° C. In some embodiments, the reflow process forms intermetallic compounds (not shown) at interfaces between the solder joints 1601 and respective seed layers 801, and at interfaces between the solder joints 1601 and the respective bond pads 1501b of the RDL 1501. By using the solder joints 1601 instead of adhesive films (such as, for example, die attach films) to attach the integrated circuit dies 901, the thermal resistance may be reduced by about 1.2%. In some embodiments, after placing the integrated circuit dies 901 on the respective bond pads 1501b of the RDL 1501, the integrated circuit dies 901 may be misaligned with respect to the respective bond pads 1501b of the RDL 1501. In some embodiments, the reflow process may reduce overlay shifts between the integrated circuit dies 901 and the respective bond pads 1501b of the RDL 1501 and may self-align the integrated circuit dies 901 with respect to the respective bond pads 1501b of the RDL 1501. In the illustrated embodiment, backsides of integrated circuit dies 901 are attached to the respective bond pads 1501b of the RDL 1501. Accordingly, the RDL 1501 may be also referred to as a backside RDL 1501 and the redistribution structure 1503 may also be referred to a backside redistribution structure 1503.

Figure 17:
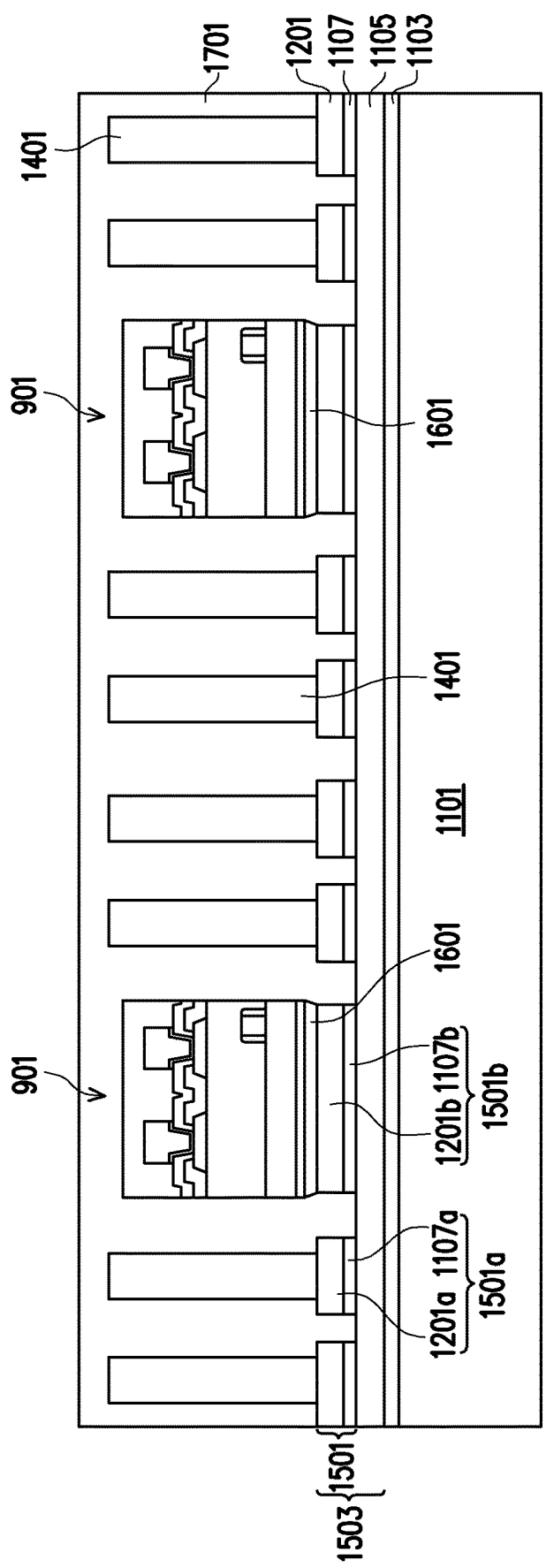

Referring to FIG. 17, an encapsulant 1701 is formed over the carrier 1101, and over and surrounding the integrated circuit dies 901 and the conductive pillars 1401. In some embodiments, the encapsulant 1701 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the integrated circuit dies 901 and the conductive pillars 1401.

Figure 18:
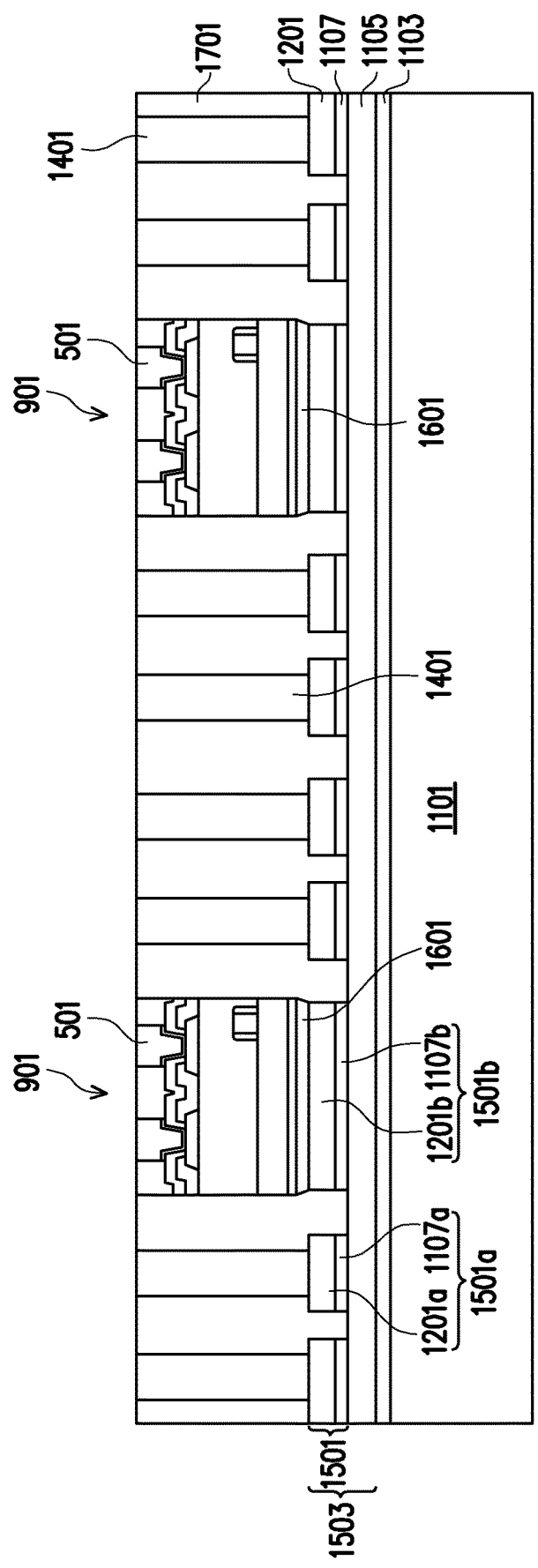

Referring to FIG. 18, in some embodiments, the encapsulant 1701 is planarized using a CMP process, a grinding process, a combination thereof, or the like. In some embodiments, the planarization process is performed until the conductive pillars 501 of the integrated circuit dies 901 are exposed. In some embodiments, top surfaces the conductive pillars 501 are substantially coplanar with top surfaces of the conductive pillars 1401 and a top surface of the encapsulant 1701. In some embodiment where the solder layers 503 (see FIG. 6) are not removed immediately after the electrical testing process described above with reference to FIG. 6, the planarization process may also remove the solder layers 503 from over the conductive pillars 501.

Figure 19:
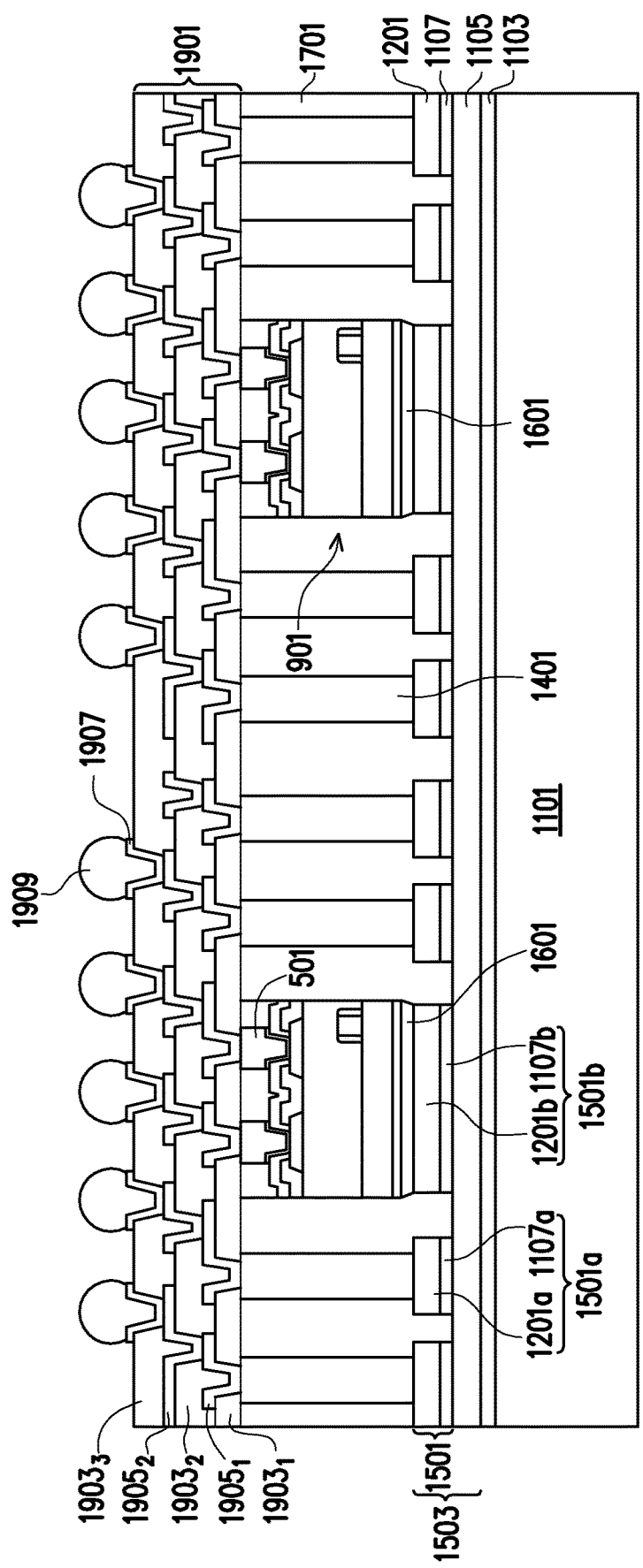

Referring to FIG. 19, a redistribution structure 1901 is formed over the integrated circuit dies 901, the conductive pillars 1401 and the encapsulant 1701. In some embodiments, the redistribution structure 1901 may comprise insulating layers 1903$_1$-1903$_3$, and redistribution layers (RDLs) 1905$_1$ and 1905$_2$ (comprising conductive lines and vias) disposed within the insulating layers 1903$_1$-1903$_3$. In some embodiments, the insulating layers 1903$_1$-1903$_3$ may be formed using similar materials and methods as the buffer layer 201 described above with reference to FIG. 2 and the description is not repeated herein. In some embodiments, the RDLs 1905$_1$ and 1905$_2$ may be formed using similar materials as the conductive pillars 501 described above with reference to FIG. 5 and the description is not repeated herein. In the illustrated embodiment, the redistribution structure 1901 is formed on front sides of the integrated circuit dies 901. Accordingly, the redistribution structure 1901 may be also referred to as a front-side redistribution structure 1901 and the RDLs 1905$_1$ and 1905$_2$ may be also referred to as front-side RDLs 1905$_1$ and 1905$_2$.

Referring further to FIG. 19, in some embodiments, process steps for forming the redistribution structure 1901 may include patterning the insulating layer 1903$_1$ to form openings therein. In some embodiments, the insulating layer 1903$_1$ may be patterned using similar methods as used, for example, for patterning the buffer layer 201 described above with reference to FIG. 2 and the description is not repeated herein. The RDL 1905$_1$ is formed over the insulating layer 1903$_1$ and in the openings in the insulating layer 1903$_1$ to contact the conductive pillars 1401 and the conductive pillars 501. The RDL 1905$_1$ may comprise various lines/traces (running "horizontally" across a top surface of the insulating layer 1903$_1$) and/or vias (extending "vertically" into the insulating layer 1903$_1$). In some embodiments, a seed layer (not shown) is deposited over the insulating layer 1903$_1$ and in the openings within the insulating layer 1903$_1$. The seed layer may be formed using similar materials and methods as the seed layer 301 described above with reference to FIG. 3 and the description is not repeated herein. Subsequently, a patterned mask (not shown) is formed over the seed layer to define the desired pattern for the RDL 1905$_1$. In some embodiments, the patterned mask having openings therein may be formed using similar materials and methods as the patterned mask 401 described above with reference to FIG. 4 and the description is not repeated herein. In some embodiments, a conductive material is formed on the seed layer by an electro-chemical plating process, an electroless plating process, ALD, PVD, sputtering, a combination thereof, or the like. Subsequently, the patterned mask is removed and portions of the seed layer exposed after removing the patterned mask are also removed. In some embodiments, the patterned mask may be removed using similar methods as the patterned mask 401 described above with reference to FIG. 6 and the description is not repeated herein. In some embodiments, exposed portions of the seed layer may be removed using similar methods as the exposed portions of the seed layer 301 described above with reference to FIG. 6 and the description is not repeated herein. In some embodiments, the insulating layer 1903$_2$, the RDL 1905$_2$, and the insulating layer 1903$_3$ are formed over the insulating layer 1903$_1$ and the RDL 1905$_1$, which completes the formation of the redistribution structure 1901. In some embodiments, the RDL 1905$_2$ may be formed over the insulating layer 1903$_2$ using similar methods as the RDL 1905$_1$ and the description is not repeated herein. In some embodiments, the RDL 1905$_2$ extends through the insulating layer 1903$_2$ and contacts portions of the RDL 1905$_1$.

As shown in FIG. 19, the redistribution structure 1901 comprises three insulating layers (such as insulating layers 1903$_1$-1903$_3$) and two RDLs (such as the RDLs 1905$_1$ and 1905$_2$) interposed between respective insulating layers. One skilled in the art will recognize that the number of insulating layers and the number of RDLs are provided for illustrative purpose only and are not limiting the scope of the present disclosure. In other embodiments, the redistribution structure may comprise appropriate numbers of insulating layers and RDLs depending on design requirements for the resulting packaged device.

Referring further to FIG. 19, underbump metallizations (UBMs) 1907 are formed over and electrically coupled to the redistribution structure 1901. In some embodiments, a set of openings may be formed through the insulating layer 1903$_3$ to expose portions of the RDL 1905$_2$. In some embodiments, the UBMs 1907 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 1907. Any suitable materials or layers of material that may be used for the UBMs 1907 are fully intended to be included within the scope of the current application. In some embodiments, connectors 1909 are formed over and electrically coupled to the UBMs 1907. In some embodiments, the connectors 1909 may be solder balls, controlled collapse chip connection (C4) bumps, ball grid array (BGA) balls, micro bumps, electroless nickel-electroless palladium-immersion gold technique (ENEPIG) formed bumps, or the like. In some embodiments where the connectors 1909 are formed of solder materials, a reflow process may be performed in order to shape the solder material into the desired bump shapes. In other embodiments, the connectors 1909 may be conductive pillars, which may be formed using similar materials and methods as the conductive pillars 501 described above reference to FIG. 5 and the description is not repeated herein. In some embodiments where the connectors 1909 comprise conductive pillars, the connectors 1909 may further comprise cap layers that may be formed on the top of the conductive pillars. In some embodiments, the cap layers may comprise a solder, nickel, tin, tin-lead, gold, silver, palladium, indium, nickel-palladium-gold, nickel-gold, the like, a combination thereof, or the like, and may be formed using an electro-chemical plating process, an electroless plating process, a combination thereof, or the like.

Figure 20:
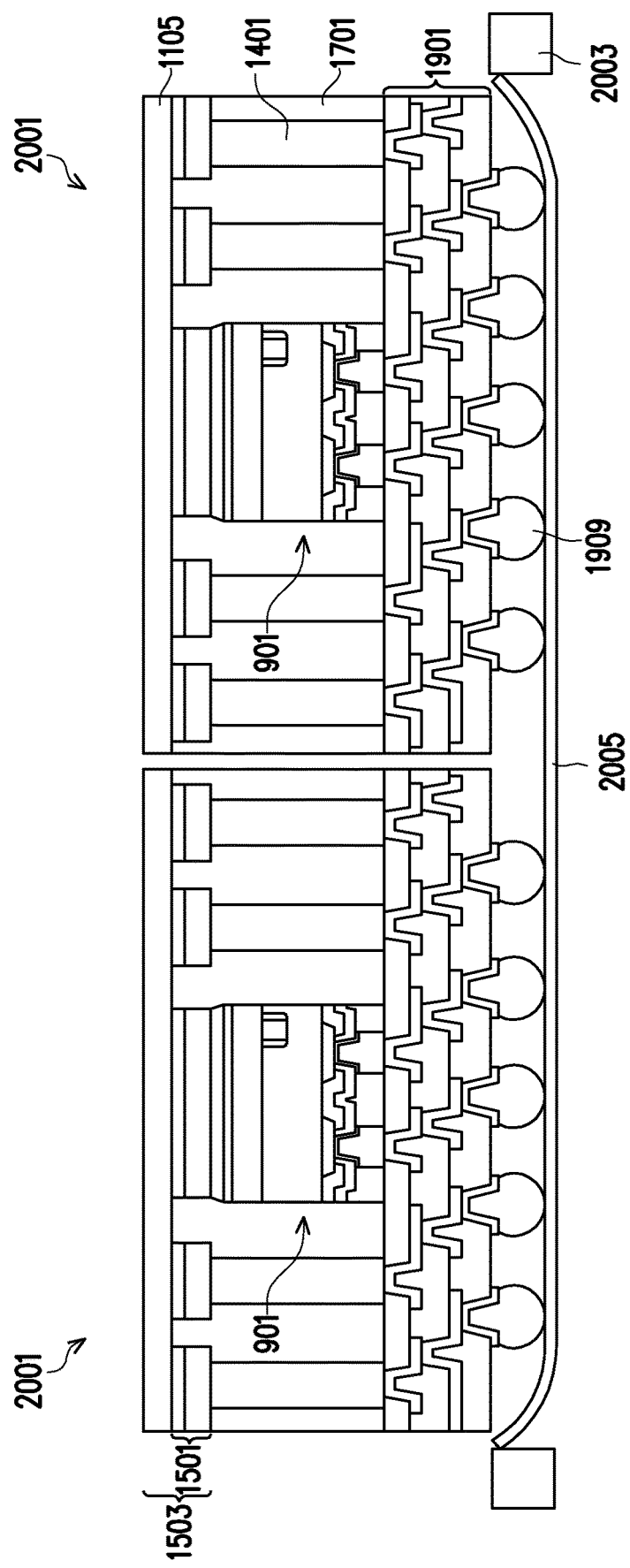

Referring to FIG. 20, after forming the connectors 1909 over the redistribution structure 1901, the resulting structure is attached to a tape 2005 supported by a frame 2003 such that the connectors 1909 contact the tape 2005. In some embodiment, the tape 2005 may comprise a die attach film, a dicing tape, or the like. Subsequently, the carrier 1101 (see FIG. 19) is detached from the resulting structure to expose the insulating layer 1105. After detaching the carrier 1101, the resulting structure may be diced to form individual integrated circuit packages 2001. In some embodiments, the resulting structure may be diced by sawing, a laser ablation method, a combination thereof, or the like. Subsequently, each of the integrated circuit packages 2001 may be tested to identify known good packages (KGPs) for further processing.

Figure 21:
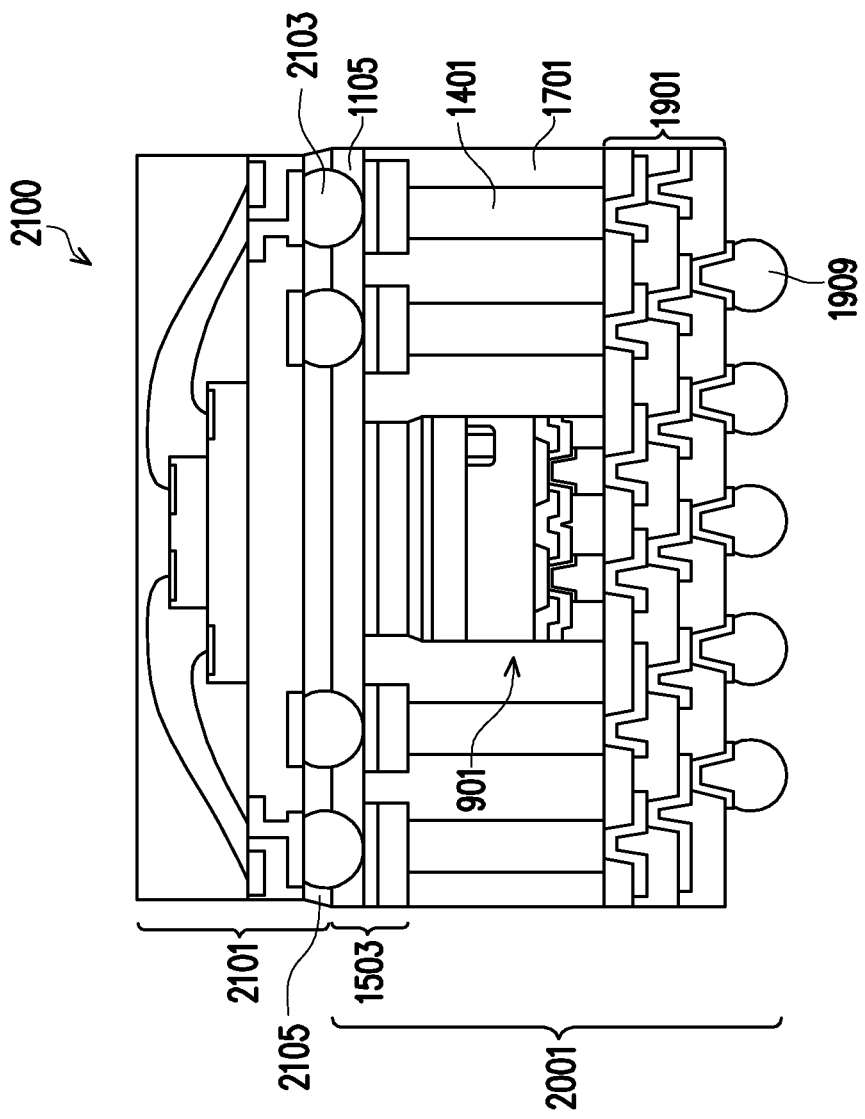

Referring to FIG. 21, in some embodiments, a workpiece 2101 is bonded to the integrated circuit package 2001 with a set of connectors 2103 extending through openings in the insulating layer 1105 to form a stacked semiconductor device 2100. In the illustrated embodiment, the workpiece 2101 is a package. In other embodiments, the workpiece 2101 may be one or more dies, a printed circuit board (PCB), a package substrate, an interposer, or the like. In some embodiments wherein the workpiece 2101 is a package, the stacked semiconductor device 2100 is a package-on package (PoP) device. In other embodiments wherein the workpiece 2101 is a die, the stacked semiconductor device 2100 is a chip-on-package (CoP) device. In some embodiments, the connectors 2103 may be formed using similar material and methods as the connectors 1909 described above with reference to FIG. 19 and the description is not repeated herein. In other embodiments, the workpiece 2101 may be bonded to the RDL 1501 of the redistribution structure 1503 before the dicing process described above with reference to FIG. 20.

Referring further to FIG. 21, an underfill material 2105 may be injected or otherwise formed in the space between the workpiece 2101 and the integrated circuit package 2001 and surrounding the connectors 2103. The underfill material 2105 may, for example, be a liquid epoxy, deformable gel, silicon rubber, or the like, that is dispensed between the structures, and then cured to harden. This underfill material 2105 may be used, among other things, to reduce damage to and to protect the connectors 2103.

Figure 22:
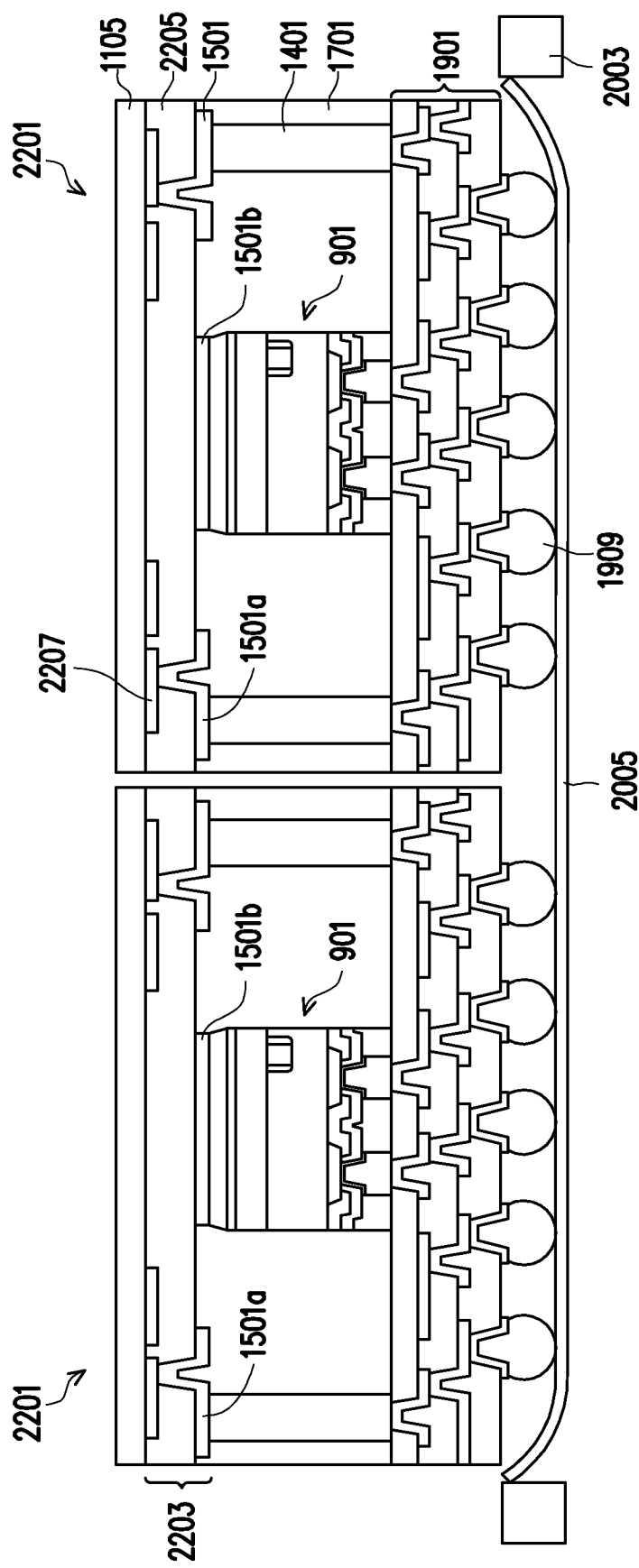
FIGS. 22 and 23 are cross-sectional views of various processing steps during fabrication of integrated circuit packages in accordance with some embodiments.
Figure 23:
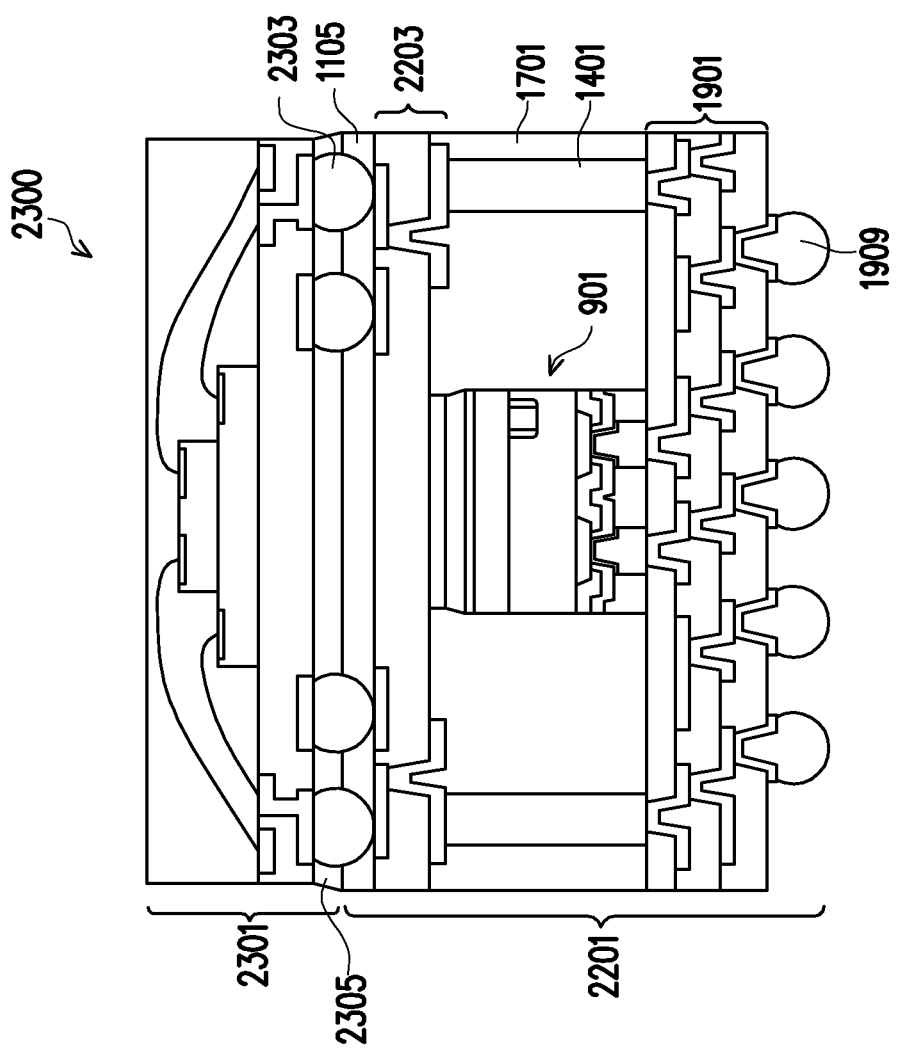

FIGS. 22 and 23 are cross-sectional views of various processing steps during fabrication of integrated circuit packages in accordance with some embodiments. FIG. 22 illustrates a structure similar to the structure illustrated in FIG. 20, with like elements labeled using like numerical references. In distinction with the structure of FIG. 20, the structure of FIG. 22 comprises the backside redistribution structure 2203 comprising a plurality of RDLs, such as RDLs 1501 and 2207, and a plurality of insulating layers, such as insulating layers 1105 and 2205.

Referring to FIG. 22, in some embodiments, after forming the insulating layer 1105 over the carrier 1101 and before forming the RDL 1501 and the conductive pillars 1401 as described above with reference to FIGS. 11-15, an RDL 2207 is formed over the insulating layer 1105 and the insulating layer 2205 is formed over the RDL 2207. In some embodiments, the insulating layer 2205 may be formed using similar materials and methods as the insulating layer 1105 described above with reference to FIG. 11 and the description is not repeated herein. In some embodiments, the RDL 2207 may be formed using similar materials and methods as, for example, the RDL 1905₁ described above with reference to FIG. 19 and the description is not repeated herein. In some embodiments, after forming the RDL 2207 and the insulating layer 2205, the process steps described above with reference to FIGS. 11-19 may be performed to form the structure illustrated in FIG. 22. One skilled in the art will recognize that the number of RDLs and insulating layers are provided for illustrative purpose only and are not limiting the scope of the present disclosure. In other embodiments, the redistribution structure 2203 may comprise appropriate number of RDLs and insulating layers depending on design requirements for the resulting packaged device. Subsequently, the resulting structure may be diced to form individual integrated circuit packages 2201. In some embodiments, the resulting structure may be diced by sawing, a laser ablation method, a combination thereof, or the like. Subsequently, each of the integrated circuit packages 2201 may be tested to identify known good packages (KGPs) for further processing.

Referring to FIG. 23, in some embodiments, a workpiece 2301 is bonded to the integrated circuit package 2201 with a set of connectors 2303 extending through openings in the insulating layer 1105 to form a stacked semiconductor device 2300. In the illustrated embodiment, the workpiece 2301 is a package. In other embodiments, the workpiece 2301 may be one or more dies, a printed circuit board (PCB), a package substrate, an interposer, or the like. In some embodiments wherein the workpiece 2301 is a package, the stacked semiconductor device 2300 is a package-on package (PoP) device. In other embodiments wherein the workpiece 2301 is a die, the stacked semiconductor device 2300 is a chip-on-package (CoP) device. In some embodiments, the connectors 2303 may be formed using similar material and methods as the connectors 1909 described above with reference to FIG. 19 and the description is not repeated herein. In other embodiments, the workpiece 2301 may be bonded to the RDL 2207 of the redistribution structure 2203 before the dicing process described above with reference to FIG. 22.

Referring further to FIG. 23, an underfill material 2305 may be injected or otherwise formed in the space between the workpiece 2301 and the integrated circuit package 2201 and surrounding the connectors 2303. The underfill material 2305 may, for example, be a liquid epoxy, deformable gel, silicon rubber, or the like, that is dispensed between the structures, and then cured to harden. This underfill material 2305 may be used, among other things, to reduce damage to and to protect the connectors 2303.

Figure 24:
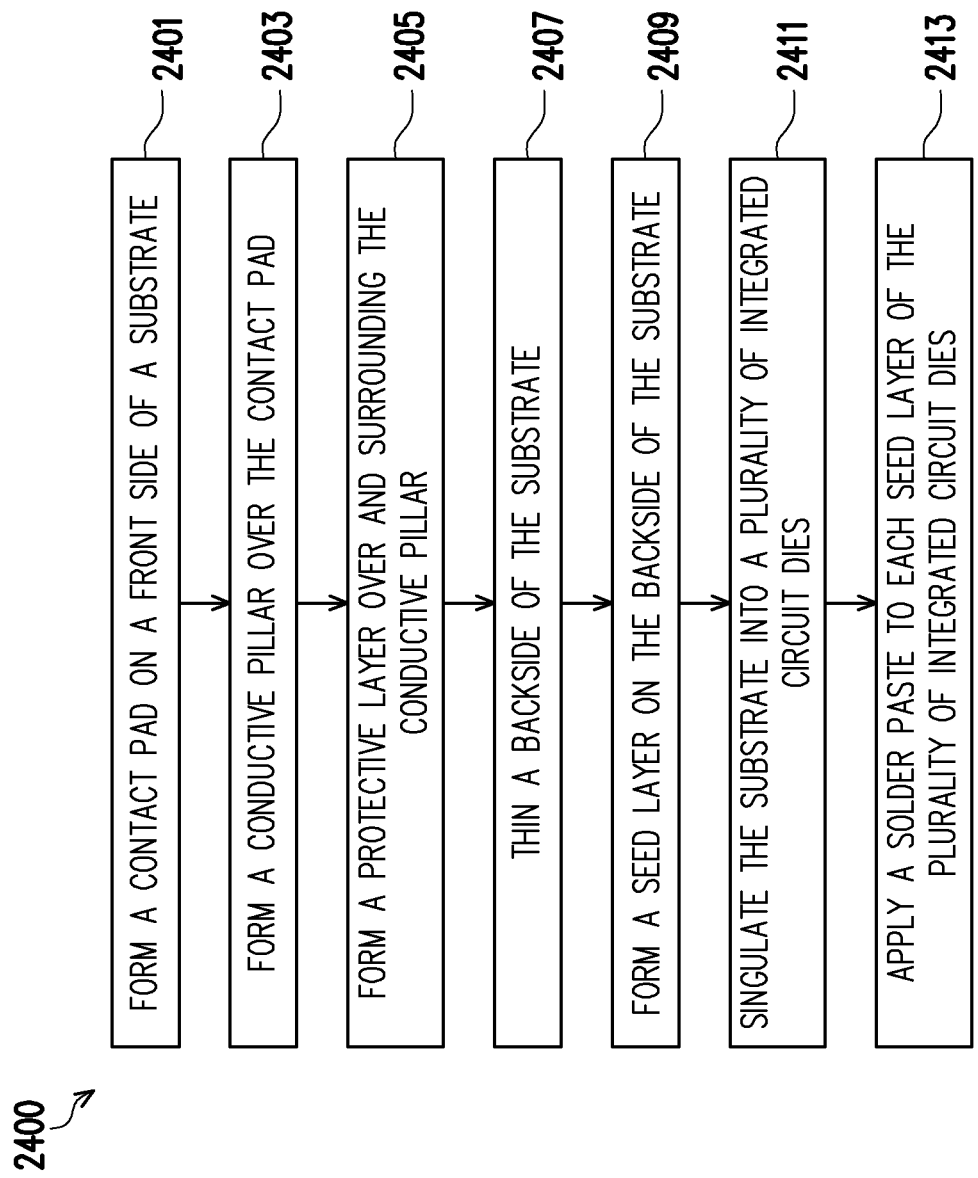
FIG. 24 is a flow diagram illustrating a method of forming an integrated circuit die in accordance with some embodiments.

FIG. 24 is a flow diagram illustrating a method 2400 of forming an integrated circuit die in accordance with some embodiments. The method starts with step 2401, where a contact pad (such as the contact pad 111 illustrated in FIG. 1) is formed over a front side (active side) of the substrate (such as the substrate 105 illustrated in FIG. 1) as described above with reference to FIG. 1. In step 2403, a conductive pillar (such as the conductive pillar illustrated in FIG. 6) is formed over the contact pad as described above with reference to FIGS. 1-6. In step 2405, a protective layer (such as the protective layer 701 illustrated in FIG. 7) is formed over and surrounding the conductive pillar as described above with reference to FIG. 7. In step 2407, a backside of the substrate is thinned as described above with reference to FIG. 7. In step 2409, a seed layer (such as the seed layer 801 illustrated in FIG. 8) is formed on the backside of the substrate as described above with reference to FIG. 8. In step 2411, the substrate is singulated into a plurality of integrated circuit dies (such as the integrated circuit dies 901 illustrated in FIG. 9) as described above with reference to FIG. 9. In step 2413, a solder paste (such as the solder paste 1001 illustrated in FIG. 10) is applied on each seed layer of plurality of integrated circuit dies as described above with reference to FIG. 10. In alternative embodiments, steps 2411 and 1413 may be swapped.

FIG. 25 is a flow diagram illustrating a method 2500 of forming an integrated circuit package in accordance with some embodiments. The method starts with step 2501, where a first redistribution layer (such as the redistribution layer 1501 illustrated in FIG. 15) is formed over a carrier (such as the carrier 1101 illustrated in FIG. 15), the first redistribution layer comprising a contact pad (such as the contact pad 1501*a* illustrated in FIG. 15) and a bond pad (such as the bond pad 1501*b* illustrated in FIG. 15) as described above with reference to FIGS. 11-15. In step 2503, a conductive pillar (such as the conductive pillar 1401 illustrated in FIG. 14) is formed over the contact pad as described above with reference to FIGS. 13 and 14. In step 2505, an integrated circuit die (such as the integrated circuit die 901 illustrated in FIG. 16) is attached to the bond pad using a solder joint (such as the solder joint 1601 illustrated in FIG. 16) as described above with reference to FIG. 16. In step 2507, an encapsulant (such as the encapsulant 1701 illustrated in FIG. 17) is formed over and surrounding the conductive pillar and integrated circuit die as described above with reference to FIG. 17. In step 2509, a second redistribution layer (such as the redistribution layer 1905$_1$ illustrated in FIG. 19) is formed over the encapsulant, the conductive pillar and integrated circuit die as described above with reference to FIGS. 18 and 19.

In accordance to an embodiment, a method includes: forming a first redistribution layer over a carrier, the first redistribution layer including a contact pad and a bond pad; forming a conductive pillar over the contact pad; attaching a backside surface of an integrated circuit die to the bond pad using a solder joint; forming an encapsulant along a sidewall of the conductive pillar and a sidewall of the integrated circuit die, a front-side surface of the integrated circuit die being substantially level with a topmost surface of the encapsulant and a topmost surface of the conductive pillar; and forming a second redistribution layer over the front-side surface of the integrated circuit die, the topmost surface of the encapsulant and the topmost surface of the conductive pillar. In an embodiment, attaching the backside surface of the integrated circuit die to the bond pad using the solder joint includes: applying a solder paste on the backside surface of the integrated circuit die; placing the integrated circuit die over the bond pad, the solder paste being in physical contact with the bond pad; and reflowing the solder paste to form the solder joint. In an embodiment, forming the first redistribution layer over the carrier includes: forming a seed layer over the carrier; forming a first patterned mask over the seed layer, the first patterned mask having a first opening and a second opening; depositing a first conductive material in the first opening and the second opening to form a first conductive feature in the first opening and a second conductive feature in the second opening; removing the first patterned mask; and removing exposed portions of the seed layer, the first conductive feature and a first portion of the seed layer under the first conductive feature forming the contact pad, the second conductive feature and a second portion of the seed layer under the second conductive feature forming the bond pad. In an embodiment, forming the conductive pillar over the contact pad includes: forming a second patterned mask over the seed layer, the first conductive feature and the second conductive feature, the second patterned mask having a third opening, the third opening exposing a portion of the first conductive feature, the second patterned mask covering the second conductive feature; depositing a second conductive material in the third opening to form the conductive pillar; and removing the second patterned mask. In an embodiment, the conductive pillar electrically connects the contact pad of the first redistribution layer to the second redistribution layer. In an embodiment, a width of the bond pad is greater than a width of the contact pad. In an embodiment, the contact pad and the bond pad are electrically isolated from one another.

In accordance to another embodiment, a method includes: forming an insulating layer over a carrier; forming a seed layer over the insulating layer; forming a first patterned mask over the seed layer, the first patterned mask having a first opening and a second opening, the first opening and the second opening exposing the seed layer; depositing a first conductive material in the first opening and the second opening to form a first conductive feature in the first opening and a second conductive feature in the second opening; removing the first patterned mask; forming a second patterned mask over the seed layer, the first conductive feature and the second conductive feature, the second patterned mask having a third opening, the third opening exposing the first conductive feature; depositing a second conductive material in the third opening to form a conductive pillar in the third opening; removing the second patterned mask; removing exposed portion of the seed layer; and attaching a backside surface of an integrated circuit die to the second conductive feature using a solder joint. In an embodiment, the method further includes forming an encapsulant along a sidewall of the conductive pillar and a sidewall of the integrated circuit die, a front-side surface of the integrated circuit die being substantially level with a topmost surface of the encapsulant and a topmost surface of the conductive pillar. In an embodiment, the method further includes forming a redistribution layer over the front-side surface of the integrated circuit die, the topmost surface of the encapsulant and the topmost surface of the conductive pillar. In an embodiment, the conductive pillar electrically couples the redistribution layer to the first conductive feature. In an embodiment, attaching the backside surface of the integrated circuit die to the second conductive feature using the solder joint includes: applying a solder paste on the backside surface of the integrated circuit die; placing the integrated circuit die over the second conductive feature, the solder paste being in physical contact with the second conductive feature; and reflowing the solder paste to form the solder joint. In an embodiment, applying the solder paste on the backside surface of the integrated circuit die includes printing the solder paste on the backside surface of the integrated circuit die. In an embodiment, the first conductive feature and the second conductive feature are electrically isolated from one another after removing the exposed portion of the seed layer.

In accordance to yet another embodiment, a semiconductor structure includes: an integrated circuit die, the integrated circuit die having a front side and a backside opposite the front side, the integrated circuit die having a plurality of contact features on the front side; an encapsulant extending along a sidewall of the integrated circuit die; a first redistribution layer on the backside of the integrated circuit die, the first redistribution layer including a contact pad and a bond pad; a solder joint interposed between the backside of the integrated circuit die and the bond pad; a second redistribution layer on the front side of the integrated circuit die; and a conductive via within the encapsulant, the conductive via extending from the first redistribution layer to the second redistribution layer. In an embodiment, the conductive via electrically connects the contact pad of the first redistribution layer to the second redistribution layer. In an embodiment, the contact pad and the bond pad are electrically isolated from one another. In an embodiment, a portion of the encapsulant extends along sidewall of the contact pad and a sidewall of the bond pad. In an embodiment, the plurality of contact features are electrically coupled to the second redistribution layer. In an embodiment, a width of the solder joint is substantially same as a width of the integrated circuit die.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an insulating layer over a carrier;
   forming a first redistribution layer over the insulating layer, the first redistribution layer comprising a contact pad and a bond pad;
   forming a conductive pillar over the contact pad;
   attaching a backside of an integrated circuit die to the bond pad using a solder joint, a width of the solder joint being greater than a width of the bond pad, the backside of the integrated circuit die comprising a first seed layer, wherein attaching the backside of the integrated circuit die to the bond pad using the solder joint comprises:
      applying a solder paste on the first seed layer of the integrated circuit die;
      placing the integrated circuit die over the bond pad, the solder paste being in physical contact with the bond pad; and
      performing a reflow process on the solder paste to form the solder joint;
   forming an encapsulant along a sidewall of the conductive pillar and a sidewall of the integrated circuit die, the encapsulant extending between the integrated circuit die and the insulating layer along a line perpendicular to the backside of the integrated circuit die; and
   forming a second redistribution layer over the integrated circuit die, a topmost surface of the encapsulant and a topmost surface of the conductive pillar.

2. The method of claim 1, wherein forming the contact pad comprises forming a conductive via in the insulating layer, wherein a bottommost surface of the conductive via is above a bottommost surface of the insulating layer in a cross-sectional view.

3. The method of claim 1, wherein the solder paste continuously extends from a first edge of the first seed layer to a second edge of the first seed layer, the first edge of the first seed layer being opposite the second edge of the first seed layer in a cross-sectional view.

4. The method of claim 1, wherein the reflow process reduces an overlay shift between the integrated circuit die and the bond pad.

5. The method of claim 1, wherein the encapsulant is in physical contact with a topmost surface and a sidewall of the contact pad in a cross-sectional view.

6. The method of claim 1, wherein a front-side surface of the integrated circuit die is level with a topmost surface of the encapsulant and a topmost surface of the conductive pillar.

7. The method of claim 1, wherein forming the second redistribution layer comprises:
   forming a dielectric layer over the encapsulant and the integrated circuit die; and
   after forming the dielectric layer, forming a conductive feature through the dielectric layer to the integrated circuit die.

8. A method comprising:
   forming an insulating layer over a carrier;
   forming a first seed layer over the insulating layer;
   forming a first patterned mask over the first seed layer, the first patterned mask having a first opening and a second opening, the first opening and the second opening exposing the first seed layer;
   depositing a first conductive material in the first opening and the second opening to form a first conductive feature in the first opening and a second conductive feature in the second opening;
   removing the first patterned mask;
   forming a second patterned mask over the first seed layer, the first conductive feature and the second conductive feature, the second patterned mask having a third opening, the third opening exposing the first conductive feature;
   depositing a second conductive material in the third opening to form a conductive pillar in the third opening;
   removing the second patterned mask to expose a sidewall and a topmost surface of the first conductive feature and a sidewall and a topmost surface of the second conductive feature;
   removing exposed portions of the first seed layer;
   depositing a second seed layer along a backside of an integrated circuit die; and
   attaching the second seed layer of the integrated circuit die to the second conductive feature using a solder joint, a width of the solder joint at an interface between the solder joint and the second seed layer being greater than a width of the second conductive feature, wherein the width of the solder joint continuously decreases from the interface between the solder joint and the second seed layer to an interface between the solder joint (1601) and the second conductive feature.

9. The method of claim 8, wherein a portion of the first conductive feature extends into the insulating layer.

10. The method of claim 9, wherein a bottommost surface of the first conductive feature is above a bottommost surface of the insulating layer.

11. The method of claim 9, wherein the first conductive feature extends over an upper surface of the insulating layer.

12. The method of claim 8, wherein attaching the second seed layer of the integrated circuit die to the second conductive feature using the solder joint comprises:
   applying a solder paste on the second seed layer of the integrated circuit die, wherein the solder paste completely covers a surface of the second seed layer facing the second conductive feature in a cross-sectional view;

after applying the solder paste on the second seed layer of the integrated circuit die, placing the integrated circuit die over the second conductive feature, the solder paste being in physical contact with the second conductive feature; and after placing the integrated circuit die over the second conductive feature, performing a reflow process to form the solder joint.

13. The method of claim 8, wherein a width of the second conductive feature is less than a width of the integrated circuit die.

14. The method of claim 8, wherein a ratio a width of the first conductive feature to the width of the second conductive feature is in a range of 0.06 to 1.

15. A method comprising:

forming an insulating layer over a carrier;

forming a contact pad and a bond pad over the insulating layer;

forming a conductive pillar over the contact pad, the conductive pillar being electrically coupled to the contact pad;

attaching a backside of an integrated circuit die to the bond pad using a solder joint, a width of the solder joint being greater than a width of the bond pad; and forming an encapsulant around the conductive pillar and around the integrated circuit die, the encapsulant being in physical contact with a sidewall of the bond pad, the encapsulant extending between the integrated circuit die and the insulating layer along a line perpendicular to the backside of the integrated circuit die.

16. The method of claim 15, wherein forming the contact pad comprises forming a conductive via extending into the insulating layer, wherein the conductive via and the contact pad are portions of a single continuous conductive feature.

17. The method of claim 16, wherein a bottommost surface of the conductive via is above a bottommost surface of the insulating layer.

18. The method of claim 15, further comprising a seed layer on a backside of the integrated circuit die, wherein attaching the backside of the integrated circuit die to the bond pad using the solder joint comprises performing a solder reflow process.

19. The method of claim 15, wherein the integrated circuit die comprises a connector, wherein a topmost surface of the connector is level with a topmost surface of the encapsulant and a topmost surface of the conductive pillar.

20. The method of claim 15, wherein a width of the bond pad is greater than a width of the contact pad.

* * * * *